United States Patent
Park et al.

(10) Patent No.: US 9,772,555 B2
(45) Date of Patent: Sep. 26, 2017

(54) METHODS OF FORMING PATTERNS USING PHOTORESISTS

(71) Applicant: SAMSUNG ELECTRONICS CO., LTD., Suwon-si, Gyeonggi-do (KR)

(72) Inventors: Cheol-Hong Park, Seoul (KR); Sang-Yoon Woo, Gwangmyeong-si (KR); Cha-Won Koh, Yongin-si (KR); Hyun-Woo Kim, Seongnam-si (KR); Sang-Min Park, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/047,659

(22) Filed: Feb. 19, 2016

(65) Prior Publication Data

US 2016/0358778 A1 Dec. 8, 2016

(30) Foreign Application Priority Data

Jun. 2, 2015 (KR) .................. 10-2015-0078132

(51) Int. Cl.

| | |
|---|---|
| *G03F 7/11* | (2006.01) |
| *G03F 7/40* | (2006.01) |
| *G03F 7/20* | (2006.01) |
| *H01L 21/027* | (2006.01) |
| *H01L 21/033* | (2006.01) |
| *G03F 7/32* | (2006.01) |
| *H01L 21/308* | (2006.01) |

(Continued)

(52) U.S. Cl.
CPC .................. *G03F 7/20* (2013.01); *G03F 7/11* (2013.01); *G03F 7/32* (2013.01); *H01L 21/0276* (2013.01); *H01L 21/0335* (2013.01); *H01L 21/0337* (2013.01); *H01L 21/0338* (2013.01); *H01L 21/3081* (2013.01); *H01L 21/31144* (2013.01); *H01L 21/32139* (2013.01); *H01L 21/76802* (2013.01); *H01L 27/10876* (2013.01)

(58) Field of Classification Search
CPC ..... G03F 7/11; G03F 7/20; G03F 7/32; H01L 21/0276; H01L 21/0338; H01L 21/0335; H01L 21/0876; H01L 21/0337
USPC ...... 430/270.1, 271.1, 273.1, 322, 325, 329, 430/330, 331
See application file for complete search history.

(56) References Cited

U.S. PATENT DOCUMENTS 6,221,680 B1 * 4/2001 Hakey ................ H01L 21/0273
257/E21.026
6,818,383 B2 11/2004 Kawai
(Continued)

FOREIGN PATENT DOCUMENTS

KR 10-2001-0087022 A 9/2001
KR 10-2006-0060298 A 6/2006
(Continued)

*Primary Examiner* — Amanda C Walke
(74) *Attorney, Agent, or Firm* — Lee & Morse, P.C.

(57) ABSTRACT

In a method of forming a pattern, a lower coating layer and a photoresist layer are sequentially formed on an object layer. An exposure process may be performed such that the photoresist layer is divided into an exposed portion and a non-exposed portion. A portion of the lower coating layer overlapping or contacting the exposed portion is at least partially transformed into a polarity conversion portion that has a polarity substantially identical to that of the exposed portion. The non-exposed portion of the photoresist layer is selectively removed.

18 Claims, 20 Drawing Sheets

(51) Int. Cl.
  *H01L 21/311*   (2006.01)
  *H01L 21/3213*  (2006.01)
  *H01L 21/768*   (2006.01)
  *H01L 27/108*   (2006.01)

(56) References Cited

U.S. PATENT DOCUMENTS

| | | | |
|---|---|---|---|
| 7,070,910 B2 | 7/2006 | Kim et al. | |
| 7,968,275 B2 | 6/2011 | Han et al. | |
| 8,053,368 B2* | 11/2011 | Burns | G03F 7/091 |
| | | | 252/79.1 |
| 8,460,856 B2 | 6/2013 | Yeh et al. | |
| 8,507,191 B2* | 8/2013 | Millward | H01L 21/0276 |
| | | | 430/323 |
| 8,632,948 B2* | 1/2014 | Padmanaban | G03F 7/091 |
| | | | 430/270.1 |
| 8,715,907 B2* | 5/2014 | Chen | G03F 7/091 |
| | | | 430/271.1 |
| 8,715,911 B2 | 5/2014 | Kim et al. | |
| 9,523,917 B2* | 12/2016 | Ban | G03F 7/32 |
| 2005/0277055 A1* | 12/2005 | Kon | G03F 7/093 |
| | | | 430/270.1 |
| 2008/0160458 A1* | 7/2008 | Van Ingen Schenau | G03F 7/0035 |
| | | | 430/322 |
| 2009/0246958 A1* | 10/2009 | Burns | G03F 7/091 |
| | | | 438/694 |
| 2010/0190106 A1 | 7/2010 | Tsubaki | |
| 2012/0009529 A1 | 1/2012 | Hatakeyama | |
| 2012/0177891 A1* | 7/2012 | Millward | H01L 21/0276 |
| | | | 428/195.1 |
| 2012/0202158 A1 | 8/2012 | Hatakeyama et al. | |
| 2013/0005150 A1 | 1/2013 | Ogihara et al. | |
| 2013/0115559 A1 | 5/2013 | Bae et al. | |
| 2013/0171825 A1 | 7/2013 | Xu | |
| 2013/0234302 A1* | 9/2013 | Hu | G03F 7/0041 |
| | | | 257/635 |
| 2013/0280912 A1 | 10/2013 | Ogihara et al. | |
| 2014/0004712 A1 | 1/2014 | Chen et al. | |
| 2014/0186772 A1 | 7/2014 | Pohlers et al. | |
| 2014/0186773 A1* | 7/2014 | Chang | G03F 7/20 |
| | | | 430/322 |
| 2014/0193753 A1 | 7/2014 | Nakasugi et al. | |
| 2014/0203114 A1 | 7/2014 | Bernard et al. | |
| 2015/0031206 A1 | 1/2015 | Endo et al. | |

FOREIGN PATENT DOCUMENTS

| | | |
|---|---|---|
| KR | 10-0762902 B1 | 10/2007 |
| KR | 10-2009-0010746 A | 1/2009 |
| KR | 10-2009-0117324 A | 11/2009 |
| KR | 10-2011-0016732 A | 2/2011 |
| KR | 10-2012-0126715 A | 11/2012 |

* cited by examiner

METHODS OF FORMING PATTERNS USING PHOTORESISTS

CROSS-REFERENCE TO RELATED APPLICATION

This application claims priority under 35 USC §119 to Korean Patent Application No. 10-2015-0078132, filed on Jun. 2, 2015 in the Korean Intellectual Property Office (KIPO), the contents of which are incorporated by reference herein in their entirety.

FIELD

Example embodiments relate to methods of forming patterns using photoresists. More particularly, example embodiments relate to methods of forming patterns from an exposure process and photoresists.

BACKGROUND

In a formation of various patterns included in a semiconductor device, a photo-lithography process using a photoresist may be implemented. For example, a photoresist layer may be divided into an exposed portion and a non-exposed portion by an exposure process. Either of the exposed portion and the non-exposed portion may be removed by a developing process to form a photoresist pattern. An object layer may be etched using the photoresist pattern as a mask to form a desired pattern.

During the exposure process, chemical structures and properties of the photoresist layer may be changed by a chemical reaction occurring in the photoresist layer.

SUMMARY

Example embodiments provide a method of forming a pattern using a photoresist with improved resolution.

According to example embodiments, there is provided a method of forming a pattern. In the method, a lower coating layer and a photoresist layer may be sequentially formed on an object layer. An exposure process may be performed such that the photoresist layer may be divided into an exposed portion and a non-exposed portion. A portion of the lower coating layer overlapping or contacting the exposed portion may be at least partially transformed into a polarity conversion portion that may have a polarity substantially identical to that of the exposed portion. The non-exposed portion of the photoresist layer may be selectively removed.

In example embodiments, the lower coating layer and the photoresist layer may be initially hydrophilic.

In example embodiments, the photoresist layer may be formed of a photoresist composition including a negative-tone photoresist polymer and a photoacid generator. A polarity of the exposed portion may be converted to be hydrophobic by an acid generated from the photoacid generator during the exposure process.

In example embodiments, the acid may be diffused into the portion of the lower coating layer under the exposed portion to form the polarity conversion portion.

In example embodiments, the lower coating layer may include a polymer having a repeating unit to which a polarity conversion group is combined.

In example embodiments, in transforming the portion of the lower coating layer, a dehydration reaction may be induced in the polarity conversion group by the acid diffused into the portion of the lower coating layer.

In example embodiments, the polarity conversion group may include a tertiary alcohol group, and a hydroxyl group included in the tertiary alcohol group may be replaced with a double bond.

In example embodiments, the object layer may be partially removed using the exposed portion as an etching mask.

According to example embodiments, there is provided a method of forming a pattern. In the method, a lower coating layer may be formed on an object layer. The lower coating layer may include a polymer to which a polarity conversion group may be combined. A photoresist layer may be formed on the lower coating layer. An exposure process may be performed on the photoresist layer such that the photoresist layer may be divided into an exposed portion having a converted polarity, and a non-exposed portion retaining a polarity thereof. A dehydration reaction may be induced in the polarity conversion group included in a portion of the lower coating layer under the exposed portion. The non-exposed portion of the photoresist layer may be removed.

In example embodiments, the lower coating layer may include a bottom of anti-reflection coating (BARC) polymer, and a polarity conversion polymer having a repeating unit to which the polarity conversion group may be combined.

In example embodiments, the repeating unit may be represented by Chemical Formula 1.

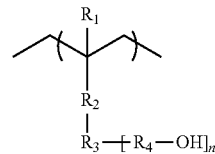

[Chemical Formula 1]

In Chemical Formula 1, $R_1$ may be hydrogen or a $C_1$-$C_4$ alkyl group. $R_2$ may be a divalent group selected from $C_1$-$C_6$ alkylene, arylene, acrylate, carbonyl, oxy, ester or a combination thereof. $R_3$ may be an alicyclic hydrocarbon group or an aromatic hydrocarbon group. $R_4$ may be a $C_3$-$C_{10}$ branched alkylene group, and n may be an integer of 1 or 2.

In example embodiments, $R_4$ may include a tert-butyl group.

In example embodiments, the lower coating layer may include a BARC polymer in which the polarity conversion group is incorporated.

In example embodiments, the BARC polymer may be represented by Chemical Formula 6.

[Chemical Formula 6]

In Chemical Formula 6, $R_1$ may be hydrogen or a $C_1$-$C_4$ alkyl group. $R_3$ may be an alicyclic hydrocarbon group or an aromatic hydrocarbon group. $R_4$ may be a $C_3$-$C_{10}$ branched alkylene group. $R_6$ may include sulfur (S), oxygen (O) or an amino group. $R_7$ may be a $C_5$-$C_{10}$ alicyclic hydrocarbon group, a $C_5$-$C_{10}$ aromatic hydrocarbon group, or a heteroring group containing sulfur or nitrogen (N). $R_8$ may be a hydroxyl group, an alkyl group combined with a hydroxyl group, or a thioether group combined with a hydroxyl group, and n may be an integer of 1 or 2.

In example embodiments, the BARC polymer may be represented by Chemical Formula 7 or Chemical Formula 8.

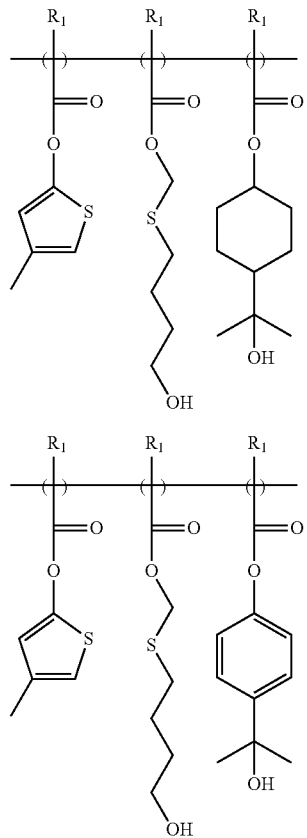

[Chemical Formula 7]

[Chemical Formula 8]

In example embodiments, in inducing the dehydration reaction, a polarity conversion portion may be formed at the portion of the lower coating layer under the exposed portion, and the polarity conversion portion and the exposed portion may be hydrophobic.

In example embodiments, the exposed portion may include a double bond created by a removal of a hydroxyl group through a dehydration reaction.

According to example embodiments, there is provided a method of forming a pattern. In the method, an isolation layer may be formed on a substrate such that an active pattern may be defined by the isolation layer. A lower coating layer and a photoresist layer may be sequentially formed on the active pattern and the isolation layer. An exposure process may be performed such that the photoresist layer may be divided into an exposed portion and a non-exposed portion. A portion of the lower coating layer overlapping or contacting the exposed portion may be at least partially transformed into a polarity conversion portion that may have a polarity substantially identical to that of the exposed portion. The non-exposed portion of the photoresist layer may be selectively removed. The active pattern may be partially removed using the exposed portion as an etching mask.

In example embodiments, the lower coating layer may include a polymer represented by Chemical Formula 3.

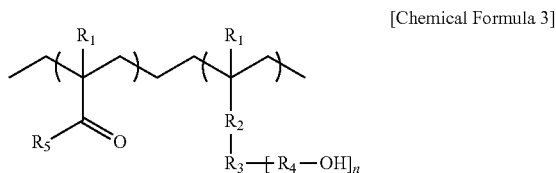

[Chemical Formula 3]

In Chemical Formula 3, $R_1$ may be hydrogen or a $C_1$-$C_4$ alkyl group. $R_2$ may be a divalent group selected from $C_1$-$C_6$ alkylene, arylene, acrylate, carbonyl, oxy, ester or a combination thereof. $R_3$ may be an alicyclic hydrocarbon group or an aromatic hydrocarbon group. $R_4$ may be a $C_3$-$C_{10}$ branched alkylene group. $R_5$ may be a hydroxyl group, a $C_1$-$C_6$ alkyl group or a $C_1$-$C_6$ alkyl group combined with a hydroxyl group, and n may be an integer of 1 or 2.

BRIEF DESCRIPTION OF THE DRAWINGS

Example embodiments will be more clearly understood from the following detailed description taken in conjunction with the accompanying drawings.

FIGS. 1 to 14 are cross-sectional views illustrating a method of forming a pattern in accordance with example embodiments; and FIGS. 15 to 30 are cross-sectional views illustrating a method of manufacturing a semiconductor device in accordance with example embodiments.

DESCRIPTION OF EMBODIMENTS

Figure 1:
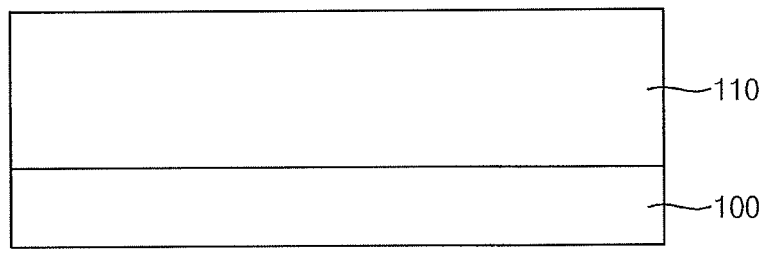
FIGS. 1 to 30 represent non-limiting, example embodiments as described herein.

Various example embodiments will be described more fully hereinafter with reference to the accompanying drawings, in which some example embodiments are shown. The example embodiments may, however, be embodied in many different forms and should not be construed as limited to those set forth herein. Rather, these example embodiments are provided so that this description will be thorough and complete, and will fully convey the scope of the embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section.

Spatially relative terms, such as "beneath," "below," "lower," "above," "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to be limiting.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 14 are cross-sectional views illustrating a method of forming a pattern in accordance with example embodiments.

Referring to FIG. 1, an object layer 110 may be formed on a substrate 100. The substrate 100 may include a semiconductor substrate such as a silicon substrate, a germanium substrate or a silicon-germanium substrate. A silicon-on-insulator (SOI) substrate or a germanium-on-insulator (GOI) substrate may be also used as the substrate 100. The substrate 100 may also include a group III-V compound such as InP, GaP, GaAs, GaSb, etc.

The object layer 110 may be converted into a predetermined or desired pattern by a photo-lithography process. In some embodiments, the object layer 110 may be formed of an insulation material such as silicon oxide, silicon nitride and/or silicon oxynitride. In some embodiments, the object layer 110 may be formed of a conductive material such as a metal, a metal silicide, a metal nitride, a metal silicide nitride or doped polysilicon. In some embodiments, the object layer 110 may be formed of a semiconductor material such as polysilicon.

The object layer 110 may be formed by at least one of a chemical vapor deposition (CVD) process, a plasma enhanced chemical vapor deposition (PECVD) process, a low pressure chemical vapor deposition (LPCVD) process, a high density plasma chemical vapor deposition (HDP-CVD) process, a spin coating process, a sputtering process, an atomic layer deposition (ALD) process and a physical vapor deposition (PVD) process.

Figure 2:
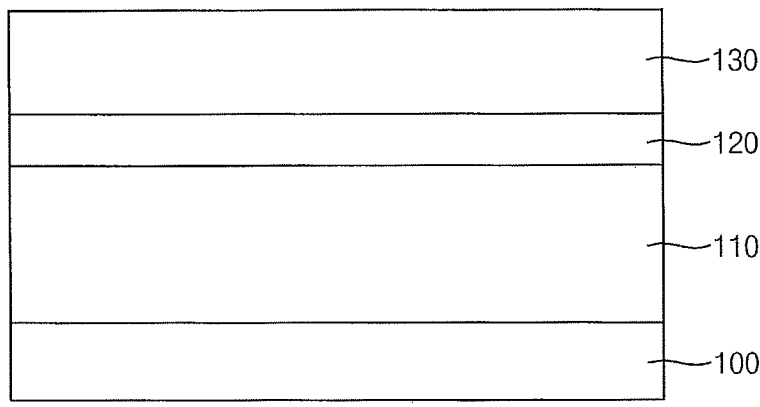

Referring to FIG. 2, a first lower coating layer 120 and a first photoresist layer 130 may be sequentially formed on the object layer 110.

The first lower coating layer 120 may be provided so that a profile and/or an adhesion of a photoresist pattern (see FIG. 5) may be improved. In some embodiments, if a light source used in an exposure process (see FIG. 3) includes a KrF source or an ArF source, the first lower coating layer 120 may also serve as an anti-reflective layer. In some embodiments, if the light source includes an extreme ultra-violet (EUV) source, the first lower coating layer 120 may also serve as a planarization layer or a leveling layer for a formation of a first photoresist layer 130 (see FIG. 2).

In some embodiments, the first lower coating layer 120 may include a bottom of anti-reflection coating (BARC) polymer and a polarity conversion polymer.

The BARC polymer may include an organic BARC polymer. Examples of the organic BARC polymer may include a polymer or a co-polymer that may be polyvinyl phenol-based, polyhydroxy styrene-based, polynorbonene-based, poly adamantly-based, polyimide-based, polyacrylate-based, polymethacrylate-based, polyfluorene-based, polysulfone-based, or the like.

In some embodiments, the BARC polymer may include a repeating unit to which a hydrophilic group such as a hydroxyl group or a carboxyl group may be combined in a backbone structure. Thus, a surface of the first lower coating layer 120 may be substantially hydrophilic.

The polarity conversion polymer may be converted from a hydrophilic polymer to a hydrophobic polymer by an acid generated during the exposure process. In an embodiment, the polarity conversion polymer may include a repeating unit to which a polarity conversion group may be combined in a backbone structure.

In example embodiments, the polarity conversion group may include an acid-labile group. In an embodiment, the polarity labile group may include a dehydration-inducing group.

For example, the polarity conversion group may include a tertiary alcohol group. While performing the exposure process, a hydroxyl group may be removed from the tertiary alcohol group through dehydrolysis by the acid diffused into the first lower coating layer 120. Accordingly, a carbocation may be created in the polymer conversion group so that a double bond may be created through, e.g., E1 mechanism.

The hydroxyl group included in the polarity conversion group may be replaced with the double bond, so that a portion of the polarity conversion polymer and/or the first lower coating layer 120 at an exposed portion which may be initially hydrophilic may become hydrophobic.

In the polarity conversion group, the tertiary alcohol group may be combined with an alicyclic hydrocarbon group or an aromatic hydrocarbon group. Accordingly, a hydrophobic property at a portion from which the hydroxyl group is removed may be enhanced.

In some embodiments, two tertiary alcohol groups may be combined with the alicyclic hydrocarbon group or the aromatic hydrocarbon group. In this case, a polarity difference between a pre-exposure and a post-exposure may be intensified.

The repeating unit including the polarity conversion group in the polarity conversion polymer may be represented by the following Chemical Formula 1.

[Chemical Formula 1]

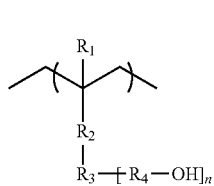

In the above Chemical Formula 1, $R_1$ may represent hydrogen or a $C_1$-$C_4$ alkyl group. R2 may be a divalent group selected from $C_1$-$C_6$ alkylene, arylene, acrylate, carbonyl, oxy, ester or a combination thereof.

A unit indicated as —$R_3$—$R_4$—OH may represent the polarity conversion group. $R_3$ may represent the alicyclic hydrocarbon group or the aromatic hydrocarbon group. For example, $R_3$ may represent the $C_5$-$C_{10}$ alicyclic hydrocarbon group or the $C_5$-$C_{10}$ aromatic hydrocarbon group. $R_4$ may represent a $C_3$-$C_{10}$ branched alkylene group. In some embodiments, $R_4$ may include a tert-butyl group. "n" may be an integer of 1 or 2.

In some embodiments, the repeating unit including the polarity conversion group may be represented by the following Chemical Formula 2.

[Chemical Formula 2]

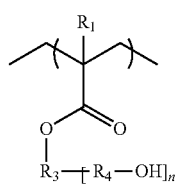

For example, the polarity conversion group may be represented by the following structural formulae.

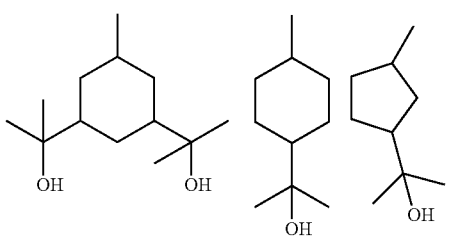

-continued

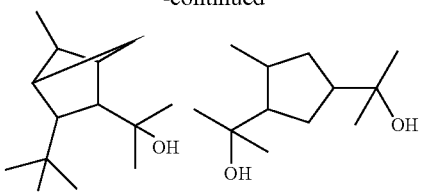

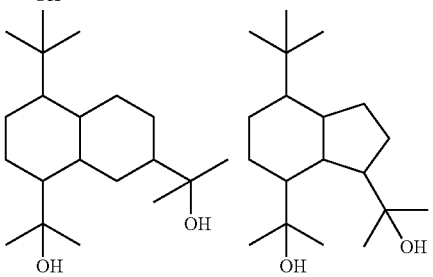

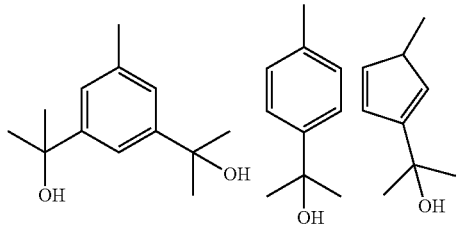

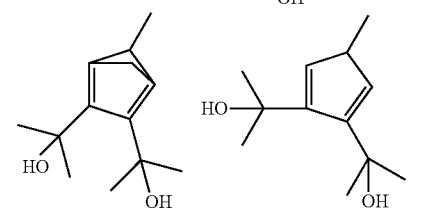

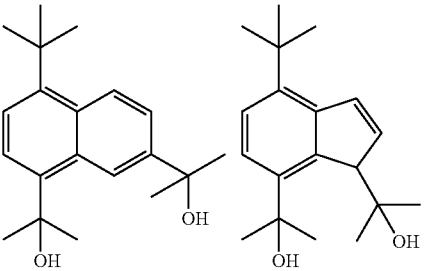

The polarity conversion polymer including the polarity conversion group may be represented by the following Chemical Formula 3.

[Chemical Formula 3]

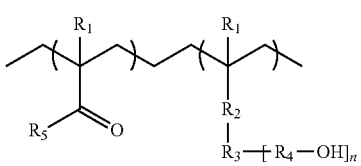

In Chemical Formula 3, $R_1$, $R_2$, $R_3$ and $R_4$ may be substantially the same as those defined in the above Chemical Formula 1. $R_5$ may include a hydroxyl group, a $C_1$-$C_6$ alkyl group or a $C_1$-$C_6$ alkyl group combined with a hydroxyl group.

A right repeating unit of Chemical Formula 3 may be the repeating unit including the polarity conversion group. A left repeating unit of Chemical Formula 3 may function as a buffer unit for improving an adhesion or a consistency with the first photoresist layer 130.

In some embodiments, the polarity conversion polymer may be represented by the following Chemical Formula 4.

[Chemical Formula 4]

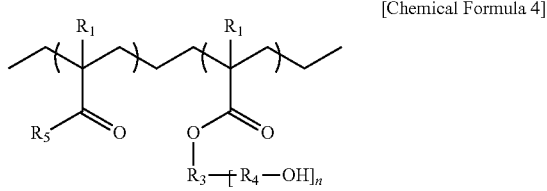

In some embodiments, the left unit designated in Chemical Formulae 3 and 4 may be omitted. In this case, the polarity conversion polymer may consist essentially of the backbone structure and the polarity conversion group combined with the backbone structure.

In some embodiments, the polarity conversion polymer may include a repeating unit that may have at least two polarity conversion groups. In this case, the polarity conversion polymer may be represented by, e.g., the following Chemical Formula 5.

[Chemical Formula 5]

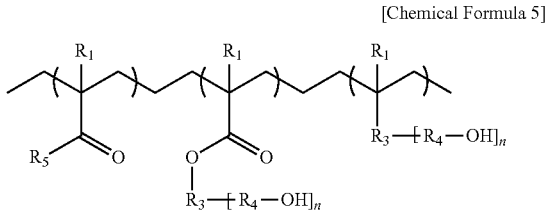

In the above Chemical Formula 5, $R_1$, $R_2$, $R_3$, $R_4$ and $R_5$ may be substantially the same as those defined by the above Chemical Formulae 1 to 3. $R_1$, $R_3$ and $R_4$ in each repeating unit of Chemical Formula 5 may be the same as or similar to each other.

In some embodiments, the polarity conversion group may be incorporated into the BARC polymer. For example, the BARC polymer may include a repeating unit to which the polymer conversion group is combined in a backbone structure thereof.

In this case, the BARC polymer may be represented by, e.g., the following Chemical Formula 6.

[Chemical Formula 6]

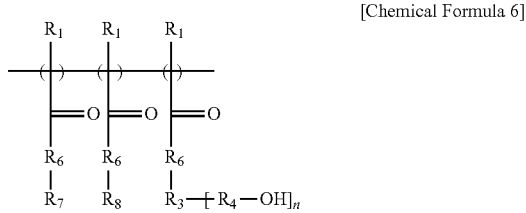

In the above Chemical Formula 6, $R_1$, $R_3$ and $R_4$ may be substantially the same as or similar to those defined by the above Chemical Formula 1. A group represented by —$R_3$—$R_4$—OH in a right repeating unit of Chemical Formula 6 may indicate the polarity conversion group.

$R_6$ may include sulfur (S), oxygen (O) or an amino group (e.g., —NH). $R_7$ may include, e.g., a $C_5$-$C_{10}$ alicyclic hydrocarbon group, a $C_5$-$C_{10}$ aromatic hydrocarbon group, or a hetroring group containing sulfur or nitrogen (N). $R_8$ may include a hydroxyl group, an alkyl group combined with a hydroxyl group, or a thioether group combined with a hydroxyl group.

A left repeating unit of Chemical Formula 6 may provide the BARC polymer with hydrophobicity. A middle repeating unit of Chemical Formula 6 may serve as a buffer unit between a hydrophilic unit and a hydrophobic unit. The right repeating unit of Chemical Formula 6 may initially provide the BARC polymer with hydrophilicity.

As described above, a polarity conversion may occur in the right repeating unit by the acid diffused from the exposure process, so that a portion of the first lower coating layer 120 at an exposed portion may become substantially hydrophobic.

For example, the BARC polymer may be represented by the following Chemical Formulae 7 and 8.

[Chemical Formula 7]

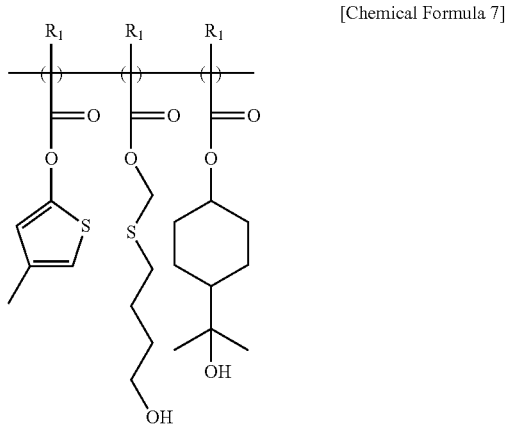

[Chemical Formula 8]

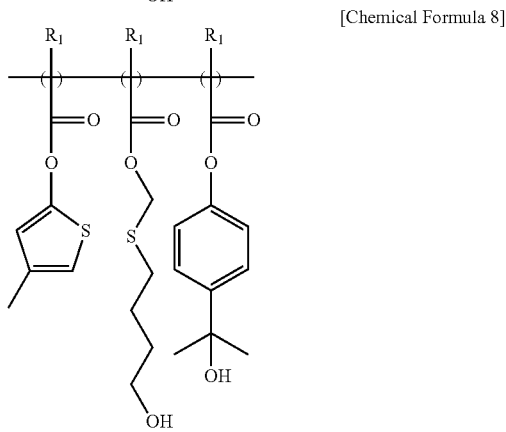

In example embodiments, the first photoresist layer 130 may be formed of a negative-tone photoresist composition. The photoresist composition may include a negative-type photoresist polymer and a solvent. The photoresist composition may further include a photoacid generator. The photoresist composition may include an additional agent such as a cross-linker, a sensitizer, etc.

The photoresist polymer may include a repeating unit in a backbone structure thereof, in which a polarity conversion may occur during an exposure process. The repeating unit of the photoresist polymer may include a hydrophilic group such as a hydroxyl group and/or a carboxylic group, and thus the first photoresist layer 130 may be substantially hydrophilic when initially coated. After the exposure process, an acid may be generated from the photoacid generator, and the hydrophilic group included in the photoresist polymer of an exposed portion may be converted to a hydrophobic group. For example, the hydrophobic group may include alkene or lactone.

In an embodiment, if a KrF source is used as a light source of the exposure process, the polarity conversion may be induced in the first photoresist layer 130 of the exposed portion according to the following Reaction Equation 1.

[Reaction Equation 1]

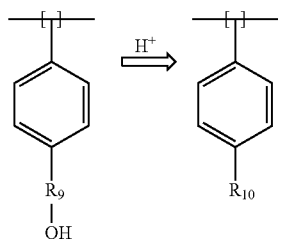

In Reaction Equation 1, $R_9$ may represent, e.g., a $C_3$-$C_{10}$ branched alkylene group. In some embodiments, $R_9$ may include a tert-butyl group. Before the exposure process, the first photoresist layer 130 may be substantially hydrophilic due to the hydroxyl group included in the repeating unit. After the exposure process, the hydroxyl group may be removed by a dehydration reaction derived by the acid ($H^+$) so that a double bond may be created. Accordingly, the exposed portion of the first photoresist layer 130 may be replaced with $R_{10}$ including an alkenyl group, and the exposed portion may be converted to a hydrophobic pattern.

In an embodiment, if an ArF source is used as the light source of the exposure process, the polarity conversion may be induced in the first photoresist layer 130 of the exposed portion according to the following Reaction Equation 2.

[Reaction Equation 2]

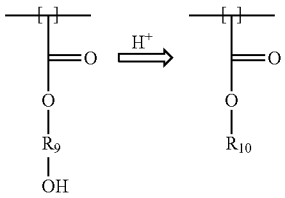

In Reaction Equation, $R_9$ and $R_{10}$ may be substantially the same as defined by the above Reaction Equation 1. For example, the hydroxyl group may be replaced with the alkenyl group so that the exposed portion may be converted to the hydrophobic pattern.

The solvent may include an organic solvent having an improved solubility suitable for a polymer material, and a coatability suitable for a formation of a uniform photoresist layer. Examples of the solvent may include, but are not limited to, cyclohexanone, cyclopentanone, tetrahydrofuran (THF), dimethylformamide, propylene glycol monomethyl ether acetate (PGMEA), ethyl lactate, methyl ethyl ketone, benzene or toluene. These may be used alone or in a combination thereof.

The photoacid generator may include any compounds capable of generating an acid by an exposure process. For example, the PAG may include, but is not limited to, an onium salt, an aromatic diazonium salt, a sulfonium salt, a triarylsulfonium salt, a diarylsulfonium salt, a monoarylsulfonium salt, an iodonium salt, a diaryliodonium salt, nitrobenzyl ester, disulfone, diazo-disulfone, sulfonate, trichloromethyl triazine, N-hydroxysuccinimide triflate, or the like. These may be used alone or in a combination thereof.

The first photoresist layer 130 may be formed using the photoresist composition by a coating process such as a spin coating process, a dip coating process, a spray coating process, or the like. In some embodiments, the photoresist composition may be coated to form a preliminary photoresist layer, and then a preliminary curing process such as a soft-baking process may be performed to obtain the first photoresist layer 130.

The first lower coating layer 120 and the first photoresist layer 130 may be initially hydrophilic. Thus, the first photoresist layer 130 may be formed on the first lower coating layer 120 with improved affinity and coatability.

Figure 3:
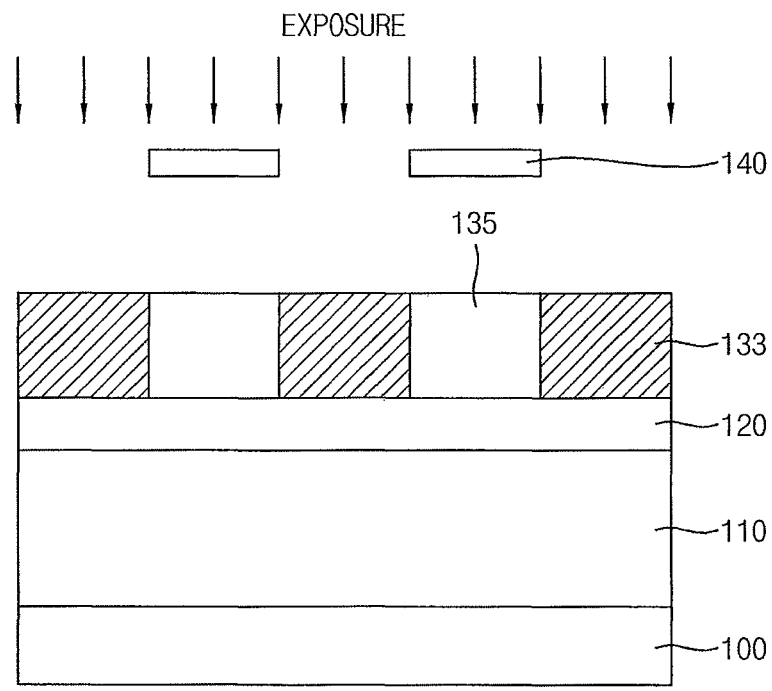

Referring to FIG. 3, an exposure process may be performed on the first photoresist layer.

In example embodiments, an exposure mask 140 may be placed on the first photoresist layer 130, and a light may be irradiated through an opening or a transmitting portion of the exposure mask 140. The light source may include, but are not limited to, an ArF source, a KrF source, an electron beam source, an I-line source or an EUV source. In some embodiments, the KrF source or the ArF source may be used as the light source.

The first photoresist layer 130 may be divided into an exposed portion 133 and a non-exposed portion 135. As described above, a chemical modification may occur at the exposed portion 133 so that a polarity of the exposed portion 133 may be converted from a hydrophilicity to a hydrophobicity.

An acid may be generated from the photoacid generator included in the exposed portion 133, and hydroxyl groups included in the photoresist polymer of the exposed portion 133 may be replaced with alkenyl groups through, e.g., a mechanism according to Reaction Equation 1 or Reaction Equation 2. Therefore, the exposed portion 133 may become substantially hydrophobic.

Figure 4:
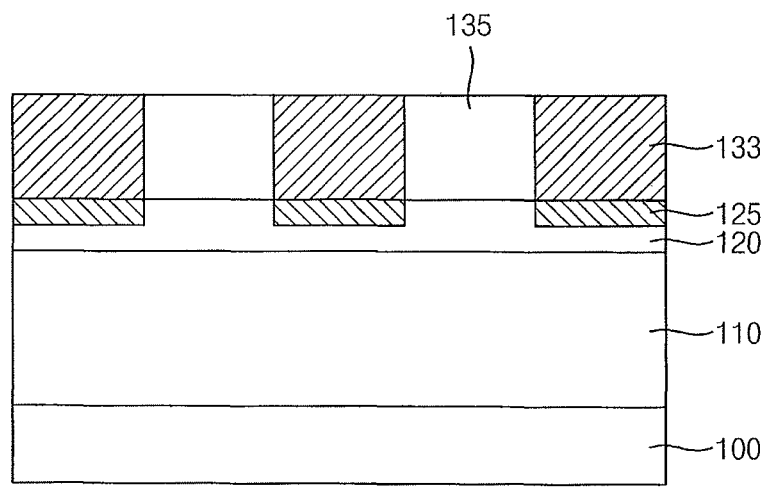

Referring to FIG. 4, a portion of the first lower coating layer 120 overlapping or contacting the exposed portion 133 may be at least partially transformed into a polarity conversion portion 125.

In example embodiments, the acid generated at the exposed portion 133 during the exposure process may be diffused to the portion of the first lower coating layer 120 contacting the exposed portion 133. A polarity conversion may be induced in the first lower coating layer 120 by the diffused acid.

In some embodiments, for example, a dehydration reaction may be induced by the acid in the polarity conversion polymer represented by the above Chemical Formulae 3 to 5 which may be included in the portion of the first lower coating layer 120. Accordingly, a hydroxyl group may be removed from the polarity conversion group to create a double bond. Thus, the portion of the first lower coating layer 120 that may be initially hydrophilic may become hydrophobic to form the polarity conversion portion 125.

In some embodiments, the polarity conversion group may be incorporated into the BARC polymer as represented by the above Chemical Formula 6, and the polarity conversion portion 125 may include the BARC polymer modified by the dehydration reaction in the polarity conversion group.

As illustrated in FIG. 4, the polarity conversion portion 125 may be in contact with the exposed portion 133, and may be formed at an upper portion of the first lower coating layer 120 overlapping the exposed portion 133. In some embodiments, the portion of the first lower coating layer 120 overlapping or contacting the exposed portion 133 may be entirely transformed into the polarity conversion portion 125.

The polarity conversion portion 125 may be hydrophobic, and the exposed portion 133 may be also hydrophobic. Therefore, a chemical affinity, an adhesion and/or a contact angle property between the polarity conversion portion 125 and the exposed portion 133 may be improved.

In some embodiments, a post exposure baking (PEB) process may be further performed. The diffusion of the acid generated in the exposed portion 133 may be facilitated by the PEB process so that the polarity conversion portion 125 may be easily formed. In an embodiment, a height or a depth of the polarity conversion portion 125 may be controlled by adjusting a temperature of the PEB process.

Figure 5:
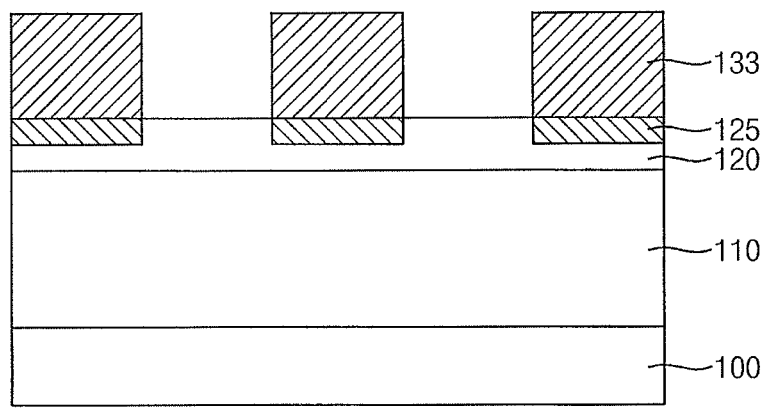

Referring to FIG. 5, the non-exposed portion 135 of the first photoresist layer 130 may be selectively removed. Accordingly, the exposed portion 133 may remain on the first lower coating layer 120 such that a photoresist pattern may be defined.

In example embodiments, the non-exposed portion 135 may be removed by a developing process using a solution such as a tetra methyl ammonium hydroxide (TMAH) solution. The TMAH solution may be hydrophilic so that the non-exposed portion 135 retaining hydrophilicity may be substantially only removed.

In some embodiments, a hard-baking process may be performed after the developing process to further cure the exposed portion 133.

Figure 6:
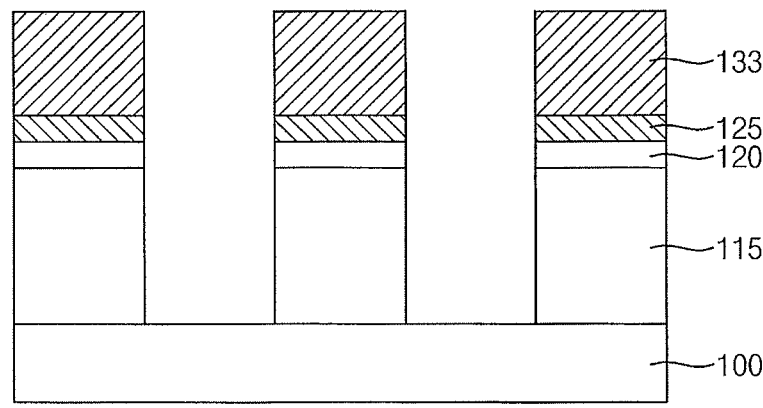

Referring to FIG. 6, the first lower coating layer 120 may be partially removed using the exposed portion 133 as an etching mask. The object layer 110 under the first lower coating layer 120 may be partially etched to form an object layer pattern 115.

The exposed portion 133 of the first photoresist layer 130 and the polarity conversion portion 125 of the lower coating layer 120 may serve as a mask pattern together during the etching process. As described above, the exposed portion 133 may have an improved stability due to a strong adhesion with the polarity conversion portion 125.

If a height of the object layer 110 increases, an etching amount for the object layer 110 may also increase. In this case, the exposed portion 133 serving as the etching mask and having a high aspect ratio may be needed. Even though the aspect ratio of the exposed portion 133 becomes greater, a bending or a collapse of the exposed portion 133 may be prevented by the polarity conversion portion 125. Thus, a photo-lithography system having a high resolution may be realized without causing a pattern mis-alignment or a grid distortion.

The etching process may include a dry etching process or a wet etching process in consideration of a material of the object layer 100, and an etching selectivity between the exposed portion 133 and the object layer 110.

In some embodiments, the dry etching process may include a plasma etching process. In some embodiments, a proper etchant solution such as fluoric acid, phosphoric acid, sulfuric acid or peroxide may be selected according to the material of the object layer 110 in the wet etching process.

Figure 7:
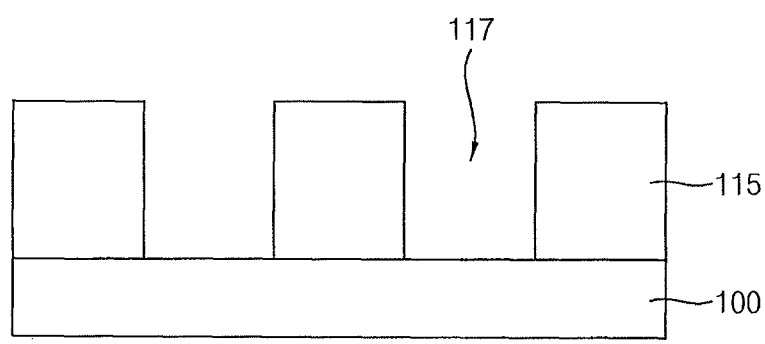

Referring to FIG. 7, the exposed portion 133, the polarity conversion portion 125 and the first lower coating layer 120 may be removed such that the object layer pattern 115 may remain on the substrate 100.

In example embodiments, the exposed portion 133, the polarity conversion portion 125 and the first lower coating layer 120 may be removed by an ashing process and/or a strip process. In some embodiments, the exposed portion 133, the polarity conversion portion 125 and the first lower coating layer 120 may be removed by a planarization process such as a chemical mechanical polish (CMP) process.

If the object layer is formed of the conductive material, the object layer pattern 115 may serve as, e.g., a wiring, a contact, a pad, a plug, an interconnection structure, etc., of a semiconductor device.

If the object layer is formed of the insulation material, the object layer pattern 155 may serve as an insulation pattern such as an insulating interlayer pattern or a filling insulation pattern. In some embodiments, a first opening 117 may be formed by a portion of the object layer 110 removed by the etching process. In some embodiments, as illustrated in FIG. 7, a top surface of the substrate 100 may be exposed through the first opening 117.

Figure 8:
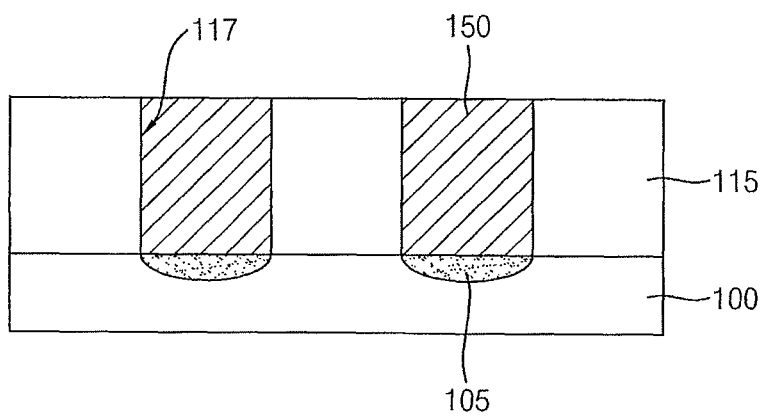

Referring to FIG. 8, in some embodiments, the object layer pattern 115 may serve as the insulation pattern. An ion-implantation process may be performed to form an impurity region 105 at an upper portion of the substrate 100 exposed through the first opening 117.

A lower conductive pattern 150 electrically connected to the impurity region 105 may be formed in the first opening 117. For example, a conductive layer sufficiently filling the first opening 117 may be formed on the object layer pattern 115. An upper portion of the conductive layer may be planarized by a CMP process until a top surface of the object layer pattern 115 may be exposed to form the lower conductive pattern 150 filling each first opening 117. For example, the lower conductive pattern 150 may serve as a contact or plug having a pillar shape.

The conductive layer may be formed of a metal such as copper, tungsten, aluminum, etc., by a deposition process including a CVD process, an ALD process and a sputtering process, or a plating process.

Figure 9:
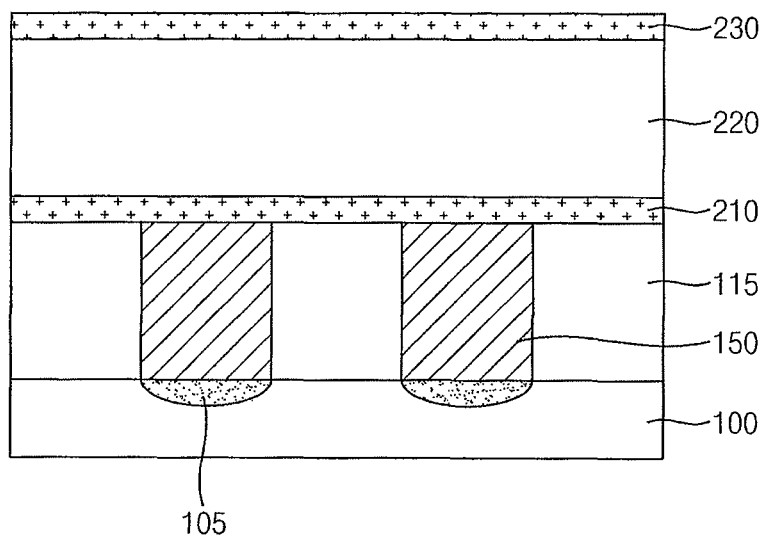

Referring to FIG. 9, a first etch-stop layer 210, an insulating interlayer 220 and a second etch-stop layer 230 may be sequentially formed on the object layer pattern 115 and the lower conductive pattern 150.

The first and second etch-stop layers 210 and 230 may be formed of, e.g., silicon nitride or silicon oxynitride. The insulating interlayer 220 may be formed of, e.g., silicon oxide or silicon oxynitride. For example, the insulating interlayer 220 may be formed of a silicon oxide-based material such as a plasma enhanced oxide (PEOX), tetraethyl orthosilicate (TEOS), boro tetraethyl orthosilicate (BTEOS), phosphorous tetraethyl orthoSilicate (PTEOS), boro phospho tetraethyl orthosilicate (BPTEOS), boro silicate glass (BSG), phospho silicate glass (PSG), boro phospho silicate glass (BPSG), or the like.

The first etch-stop layer 210, the insulating interlayer 220 and the second etch-stop layer 230 may be formed by, e.g., a CVD process, a PECVD process or an ALD process.

Figure 10:
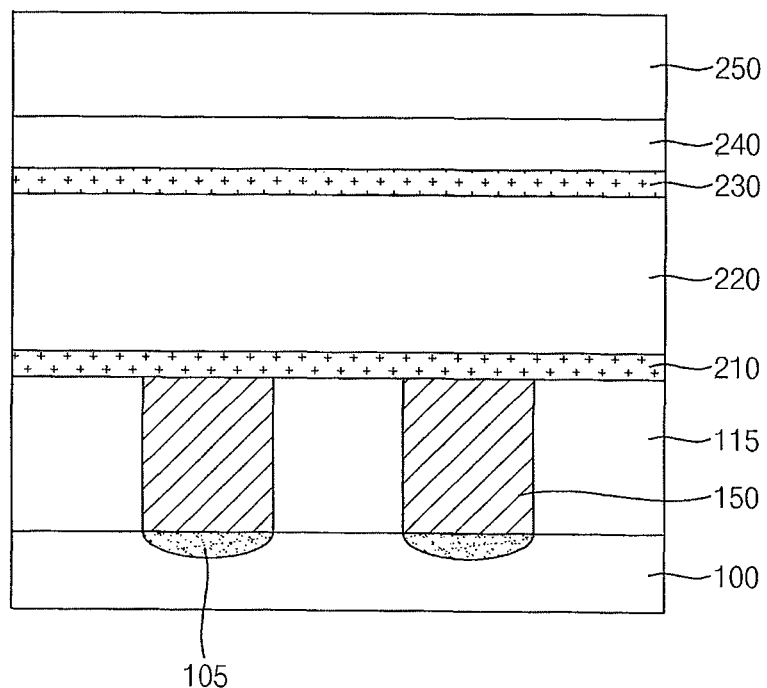

Referring to FIG. 10, a second lower coating layer 240 and a second photoresist layer 250 may be formed on the second etch-stop layer 230.

In example embodiments, the second lower coating layer 240 and the second photoresist layer 250 may be formed from materials substantially the same as those of the first lower coating layer 120 and the first photoresist layer 130, respectively, as described in FIG. 2.

For example, the second photoresist layer 250 may be formed using a negative-tone photoresist polymer in which a polarity conversion may be induced by an exposure process. The second lower coating layer 240 may be formed using a BARC composition that may include a polarity conversion polymer. In some embodiments, the second lower coating layer 240 may include a BARC polymer in which a polarity conversion group may be incorporated as a repeating unit.

Figure 11:
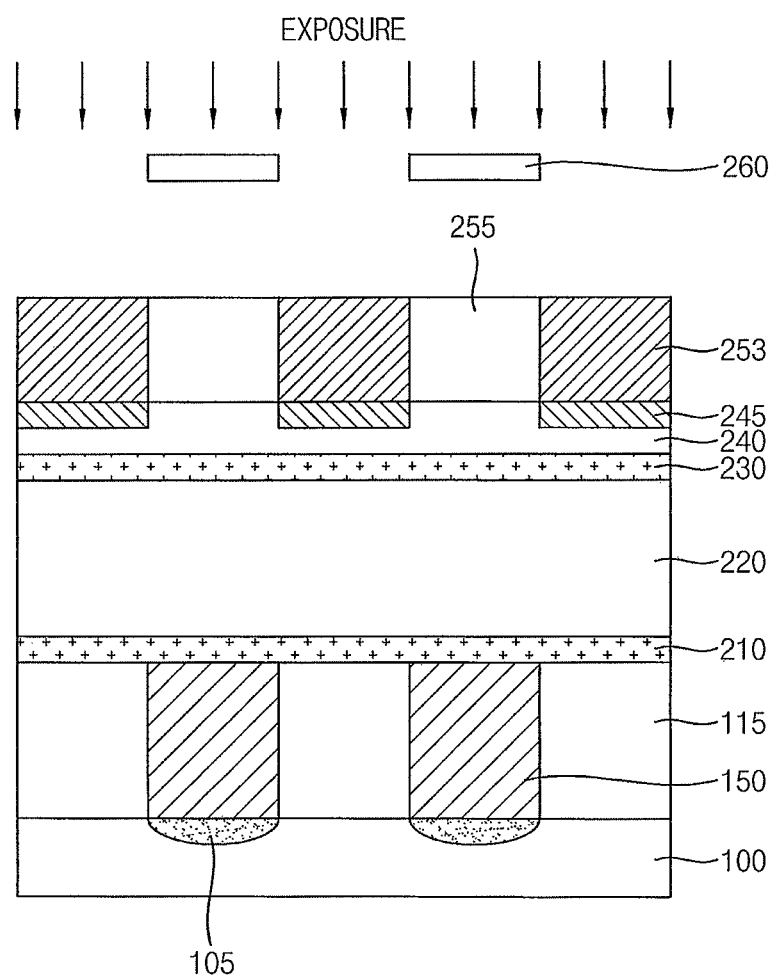

Referring to FIG. 11, processes substantially the same as or similar to those illustrated with reference to FIGS. 3 and 4 may be performed.

In example embodiments, an exposure process may be performed through an upper exposure mask 260 such that the second photoresist layer 250 may be divided into an exposed portion 253 and a non-exposed portion 255.

As described above, a polarity of the exposed portion 253 may be switched from a hydrophilicity to a hydrophobicity by a chemical modification. For example, an acid may be generated from a photoacid generator included in the exposed portion 253. Hydroxyl groups included in the photoresist polymer of the exposed portion 253 may be replaced with alkenyl groups according to a mechanism represented by the above Reaction Equation 1 or Reaction Equation 2. Thus, the exposed portion 253 may become substantially hydrophobic.

The acid may be diffused into a portion of the second lower coating layer 240 overlapping or contacting the exposed portion 253 so that a polarity conversion portion 245 may be formed.

In some embodiments, as described above, the acid may induce a dehydration reaction at the polarity conversion polymer included in the second lower coating layer 240, which may have a structure represented by, e.g., the above Chemical Formulae 3 to 5. Accordingly, a hydroxyl group may be removed from a polarity conversion group to create a double bond. Thus, the second lower coating layer 240 that may be initially hydrophilic may become hydrophobic to form the polarity conversion portion 245.

In some embodiments, the polarity conversion group may be incorporated into the BARC polymer as described with reference to Chemical Formula 6, and the polarity conversion portion 245 may include a BARC polymer modified to be hydrophobic by a dehydration reaction in the polarity conversion group.

Figure 12:
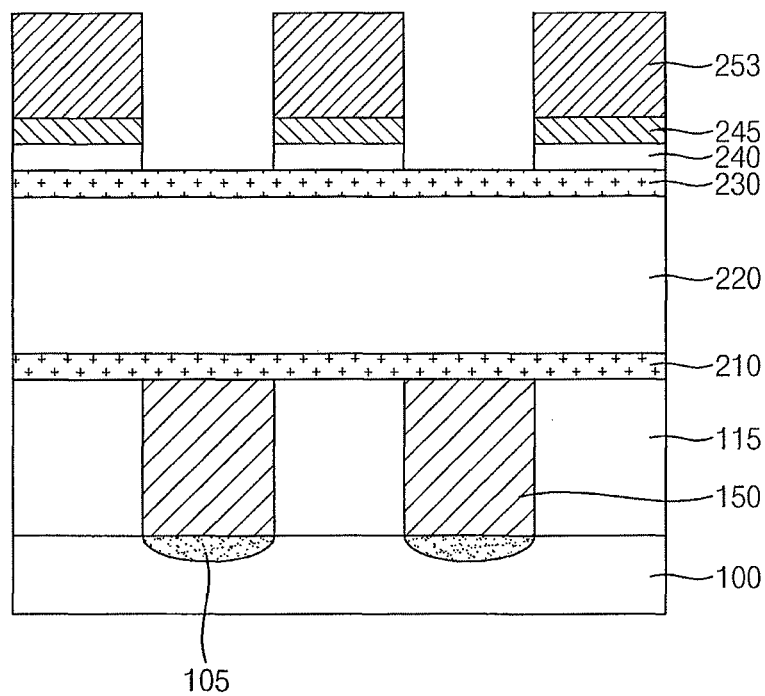

Referring to FIG. 12, as illustrated with reference to FIG. 5, the non-exposed portion 255 may be selectively removed using a hydrophilic developer solution such as a TMAH solution. Subsequently, the second lower coating layer 240 may be partially removed using the exposed portion 253 and the polarity conversion portion 245 substantially as an etching mask.

In some embodiments, a portion of the second lower coating layer 240 overlapping or contacting the non-exposed portion 255 may be also hydrophilic to be also removed by the developer solution. A top surface of the second etch-stop layer 230 may be partially exposed after the developing process.

Figure 13:
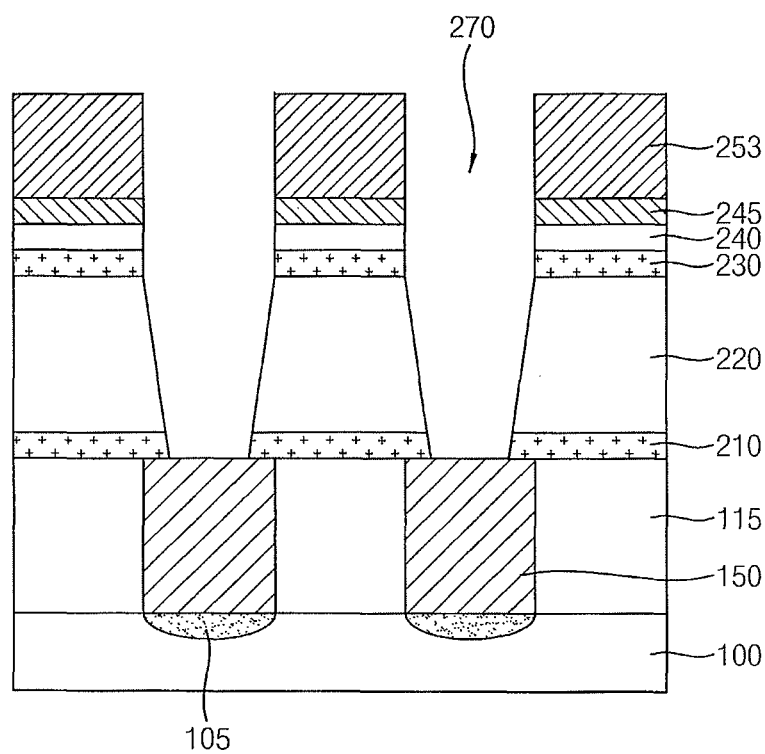

Referring to FIG. 13, the second etch-stop layer 230, the insulating interlayer 220 and the first etch-stop layer 210 may be sequentially and partially removed using the exposed portion 253, the polarity conversion portion 245 and the remaining second lower coating layer 240 substantially as an etching mask. Accordingly, a second opening 270 exposing the lower conductive pattern 150 may be formed.

The second opening 270 may be formed by a dry etching process. The second opening 270 may extend through the insulating interlayer 220 and the first etch-stop layer 210 to at least partially expose a top surface of the lower conductive pattern 150.

In some embodiments, the second opening 270 may have a contact hole shape through which each of the lower conductive patterns 150 may be exposed. In some embodiments, the second opening 270 may have a linear shape such that a plurality of the lower conductive patterns 150 may be exposed through the second opening 270.

In example embodiments, even though an etching amount of the insulating interlayer 220 may increase for the formation of the second opening 270, the exposed portion 253 serving as a photoresist pattern may function as a mechanically stable mask supported by the polarity conversion portion 245. Thus, a photo-lithography process of a high resolution may be performed for the formation of the second opening 270.

Figure 14:
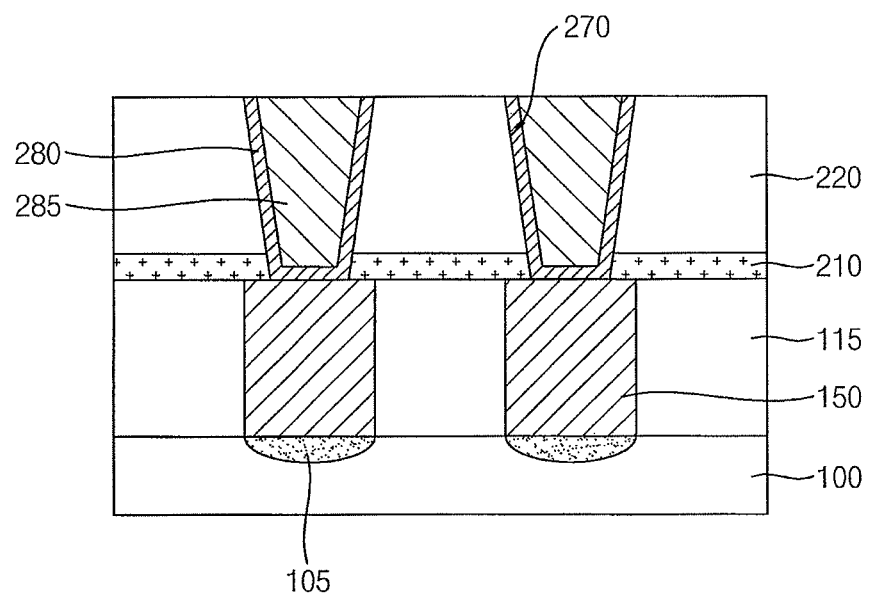

Referring to FIG. 14, an upper conductive pattern electrically connected to the lower conductive pattern 150 may be formed in the second opening 270. The upper conductive pattern may include, e.g., a barrier pattern 280 and a metal pattern 285.

In example embodiments, a barrier layer may be formed along sidewalls and bottoms of the second openings 270. A metal layer sufficiently filling the second openings 270 may be formed on the barrier layer.

The barrier layer may be formed of a metal nitride such as titanium nitride, tantalum nitride or tungsten nitride. A diffusion of metallic components included in the metal layer into the insulating interlayer 220 may be blocked by the barrier layer. Additionally, the barrier layer may provide an adhesion for the formation of the metal layer. The barrier layer may be formed by, e.g., a sputtering process or an ALD process.

The metal layer may be formed by an electroplating process. For example, a seed layer may be formed conformally on the barrier layer by a sputtering process using a copper target. A plating solution containing, e.g., copper sulfate may be used as an electrolyte, and the seed layer and the plating solution may be used as a cathode and an anode, respectively, to apply a current therethrough. Accordingly, the metal layer including copper may be precipitated or grown on the seed layer through an electrochemical reaction.

In some embodiments, the metal layer may be deposited by a sputtering process using a metal target that may include copper, tungsten or aluminum, or an ALD process.

Upper portions of the metal layer and the barrier layer may be planarized by, e.g., a CMP process until a top surface of the insulating interlayer 220 may be exposed. Accordingly, the barrier pattern 280 may be formed on the sidewall and the bottom of each second opening 270, and the metal pattern 285 filling a remaining portion of the each second opening 270 may be formed on the barrier pattern 280.

In some embodiments, the exposed portion 253, the polarity conversion portion 245, the second lower coating layer 240 and the second etch-stop layer 230 may be also removed by the CMP process. In some embodiments, before the formation of the barrier layer and the metal layer, the exposed portion 253, the polarity conversion portion 245 and the second lower coating layer 240 may be removed by an ashing process and/or a strip process.

In some embodiments, a capping layer covering a top surface of the upper conductive pattern may be further formed of a chemically stable metal such as molybdenum or cobalt.

In some embodiments, an additional insulation layer and an additional conductive pattern may be formed on the insulating interlayer 220 and the upper conductive pattern. In this case, the upper conductive pattern may serve as an interconnection structure electrically connecting the lower conductive pattern 150 and an upper wiring to each other.

FIGS. 15 to 30 are cross-sectional views illustrating a method of manufacturing a semiconductor device in accordance with example embodiments.

Figure 15:
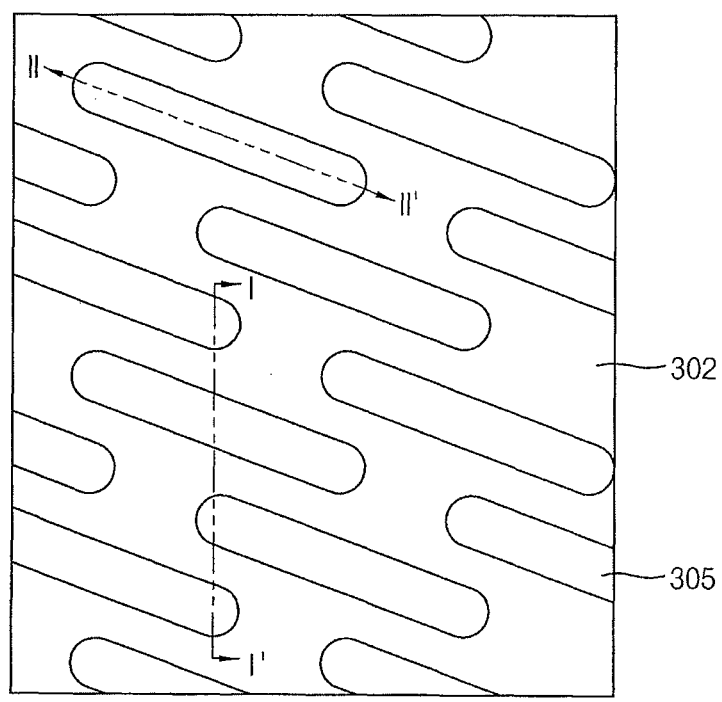
Figure 15:
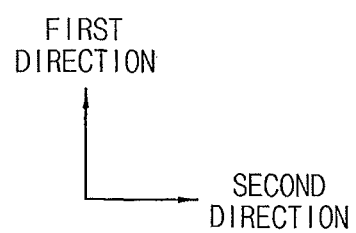
Figure 21:
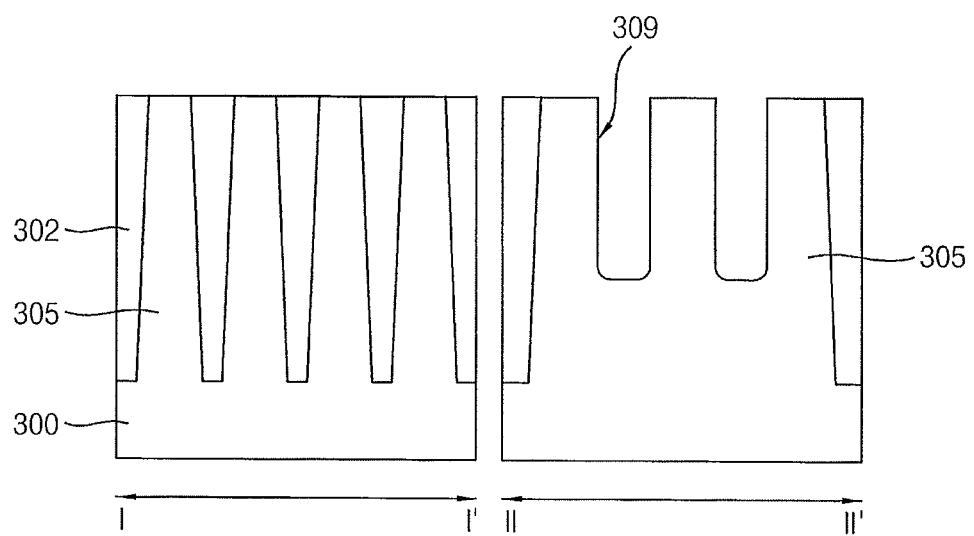
Figure 22:
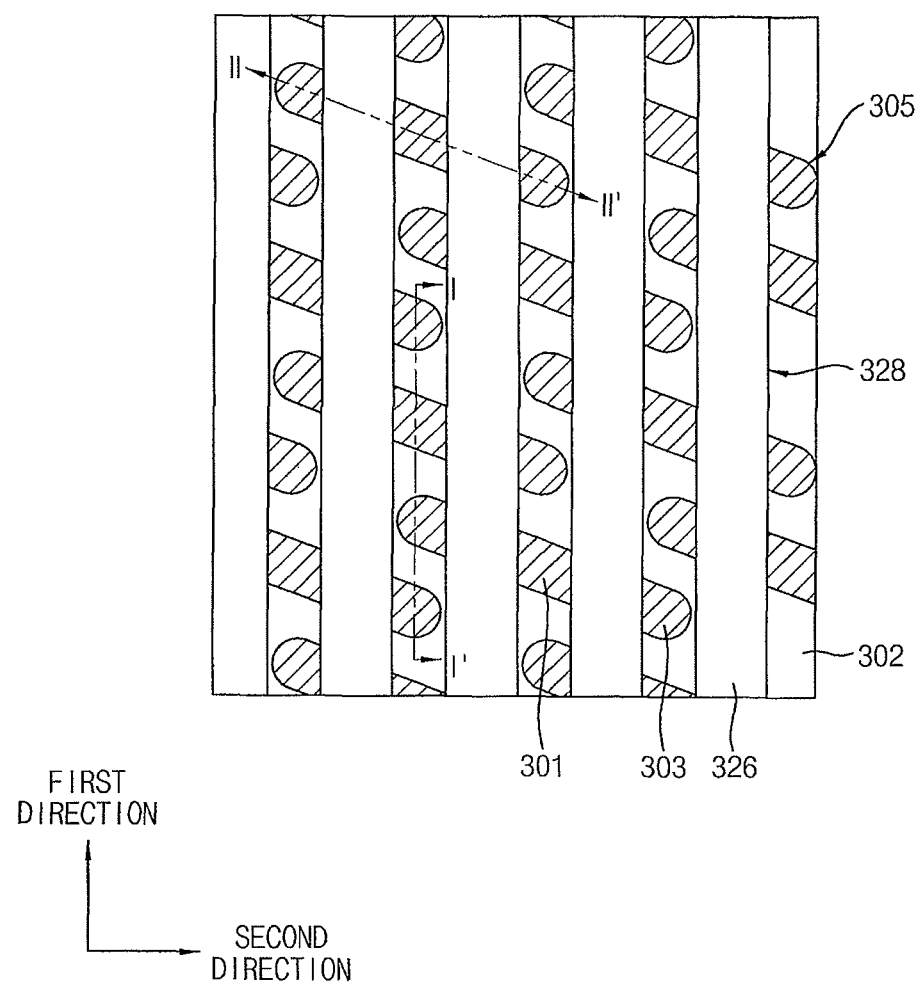
Figure 25:
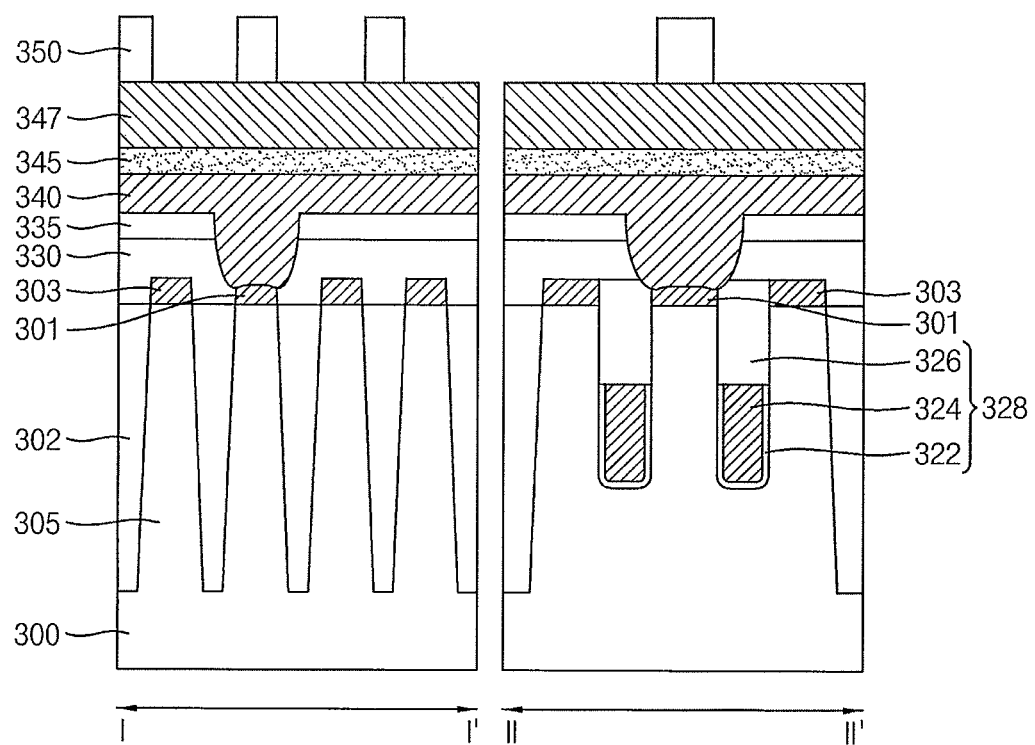
Figure 26:
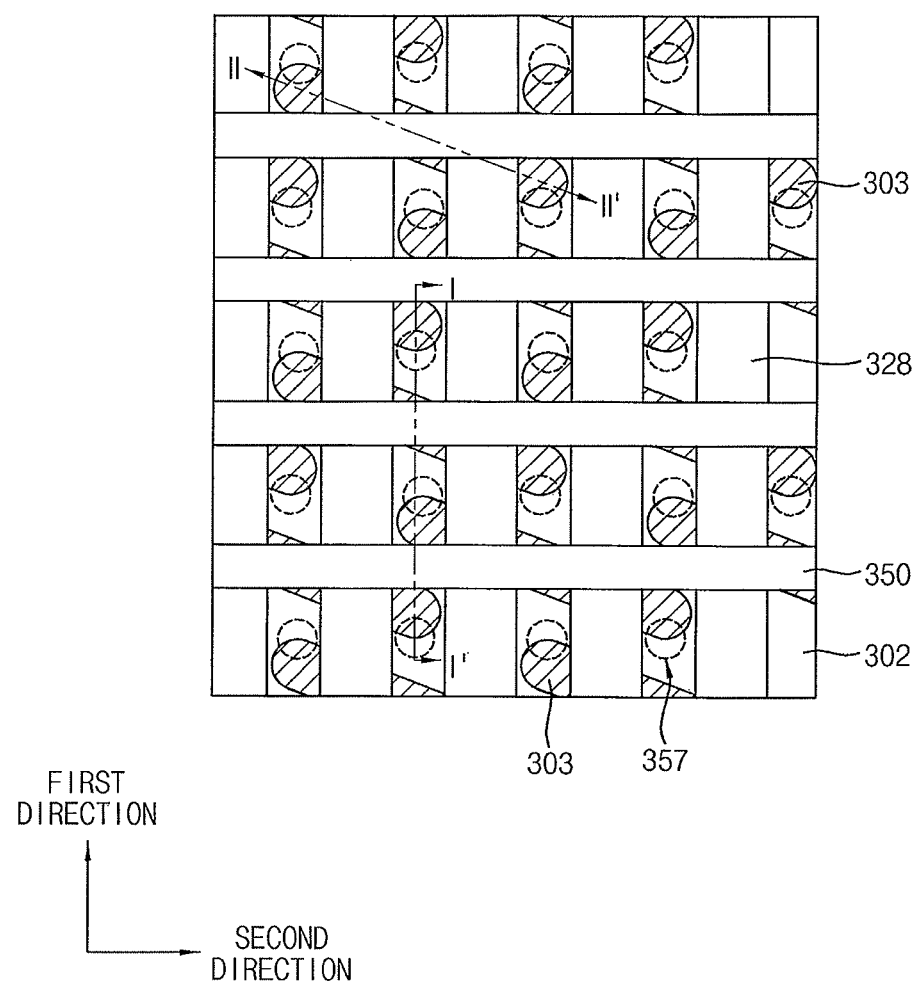

Specifically, FIGS. 15, 22 and 26 are top plan views illustrating the method of manufacturing the semiconductor device. FIGS. 16 to 21, FIGS. 23 to 25, and FIGS. 27 to 30 are cross-sectional views illustrating the method of manufacturing the semiconductor device. Each of FIGS. 16 to 21, FIGS. 23 to 25, and FIGS. 27 to 30 includes sub-cross sectional views taken along lines I-I' and II-II' indicated in FIGS. 15, 22 and 26.

For example, FIGS. 15 to 30 illustrate a method of manufacturing a semiconductor device including a buried cell array transistor (BCAT) structure. Processes and/or materials substantially the same as or similar to those illustrated with reference to FIGS. 1 to 14 are omitted herein.

In FIGS. 15 to 30, two directions perpendicular to each other are referred to as a first direction and a second direction. The first and second directions are parallel to a top surface of a substrate. Additionally, a direction indicated by an arrow and a reverse direction thereof are considered to be the same direction.

Figure 16:
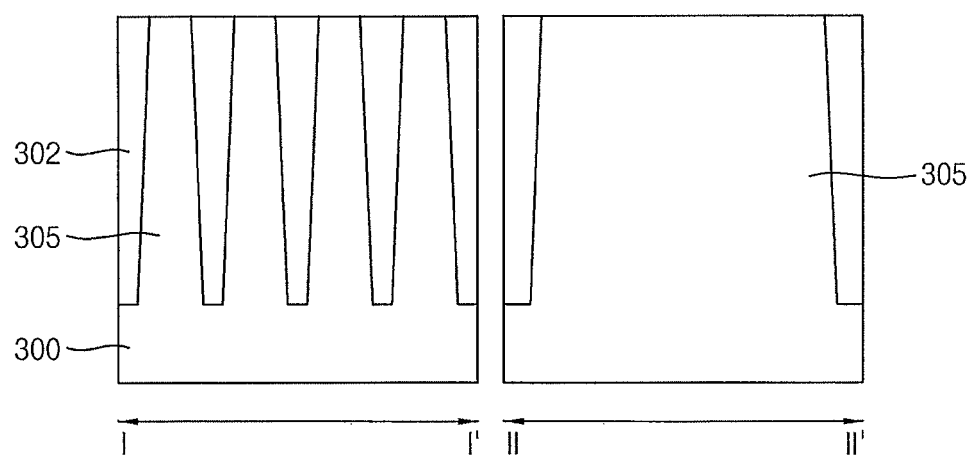

Referring to FIGS. 15 and 16, an isolation layer 302 may be formed on a substrate 300 to define active patterns 305.

The substrate 300 may include silicon, germanium, silicon-germanium or a group III-V compound such as GaP, GaAs, or GaSb. In some embodiments, the substrate 300 may be an SOI substrate or a GOI substrate.

In example embodiments, the isolation layer 302 and the active pattern 305 may be formed by a shallow trench isolation (STI) process. For example, an upper portion of the substrate 300 may be partially removed by an anisotropic etching process to form an isolation trench. An insulation layer filling the isolation trench and including, e.g., silicon oxide may be formed on the substrate 300. An upper portion of the insulation layer may be planarized by, e.g., a CMP process until a top surface of the substrate 300 may be exposed to form the isolation layer 302.

A plurality of the active patterns 305 may be formed to be spaced apart from each other by the isolation layer 302. As illustrated in FIG. 15, each active pattern 305 may extend in a diagonal direction that is inclined with a predetermined angle to the first direction or the second direction. The plurality of the active patterns 305 may be arranged in the first and second directions.

Figure 17:
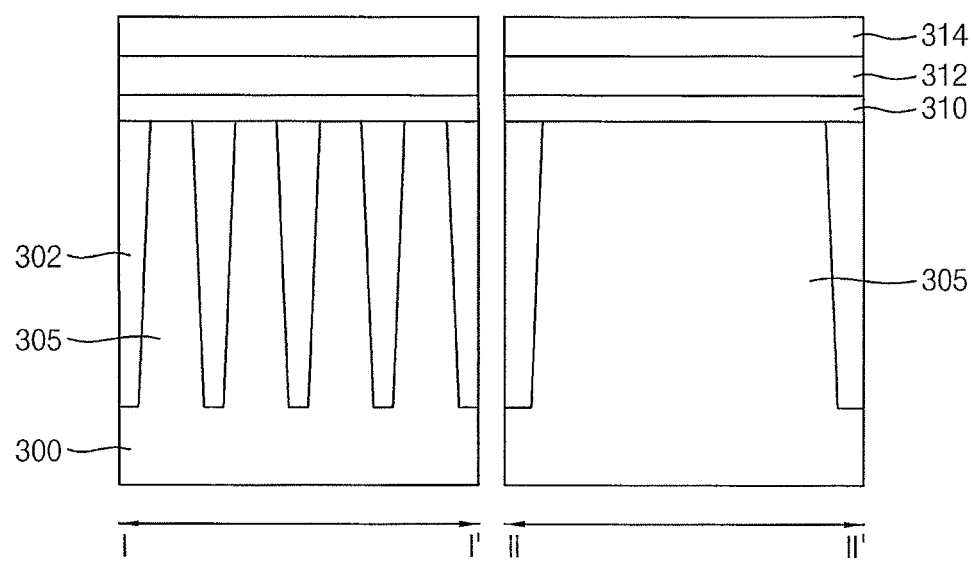

Referring to FIG. 17, an etch-stop layer 310, a lower coating layer 312 and a photoresist layer 314 may be sequentially formed on the isolation layer 302 and the active patterns 305.

The etch-stop layer 310 may be formed of silicon oxynitride or silicon nitride.

The lower coating layer 312 and the photoresist layer 314 may be formed from materials substantially the same as those of the first lower coating layer 120 and the first photoresist layer 130, respectively, as described in FIG. 2.

For example, the photoresist layer 314 may be formed using a negative-tone photoresist polymer in which a polarity conversion may be induced by an exposure process. The lower coating layer 312 may be formed using a BARC composition that may include a polarity conversion polymer. In some embodiments, the lower coating layer 312 may include a BARC polymer in which a polarity conversion group may be incorporated as a repeating unit.

Figure 18:
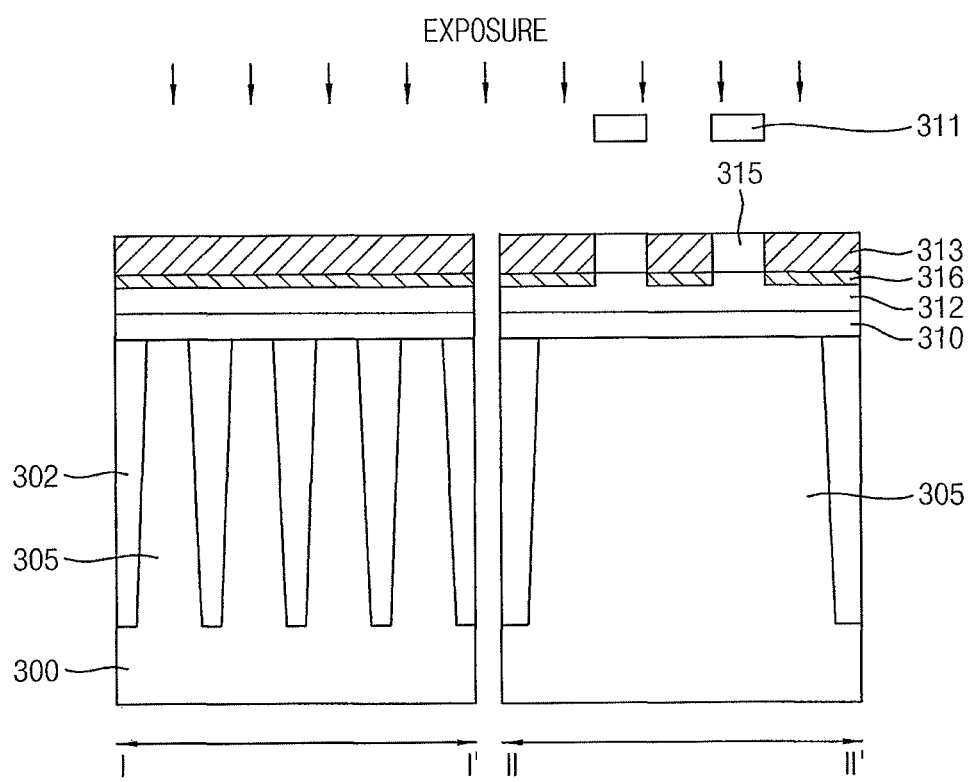

Referring to FIG. 18, processes substantially the same or similar to those illustrated with reference to FIGS. 3 and 4 may be performed.

In example embodiments, an exposure process through an exposure mask 311 may be performed such that the photoresist layer 314 may be divided into an exposed portion 313 and a non-exposed portion 315.

As described above, a polarity of the exposed portion 313 may be switched from a hydrophilicity to a hydrophobicity by a chemical modification. For example, an acid may be generated from a photoacid generator included in the exposed portion 313. Hydroxyl groups included in the photoresist polymer of the exposed portion 313 may be replaced with alkenyl groups according to a mechanism represented by the above Reaction Equation 1 or Reaction Equation 2. Thus, the exposed portion 313 may become substantially hydrophobic.

The acid may be at least partially diffused into a portion of the lower coating layer 312 overlapping or contacting the exposed portion 313 so that a polarity conversion portion 316 may be formed.

In some embodiments, as described above, the acid may induce a dehydration reaction at the polarity conversion polymer included in the lower coating layer 312, which may have a structure represented by, e.g., the above Chemical Formulae 3 to 5. Accordingly, a hydroxyl group may be removed from a polarity conversion group to create a double bond. Thus, the lower coating layer 312 that may be initially hydrophilic may become hydrophobic to form the polarity conversion portion 316.

In some embodiments, the polarity conversion group may be incorporated into the BARC polymer as described with reference to Chemical Formula 6, and the polarity conversion portion 316 may include a BARC polymer modified to be hydrophobic by a dehydration reaction in the polarity conversion group.

Figure 19:
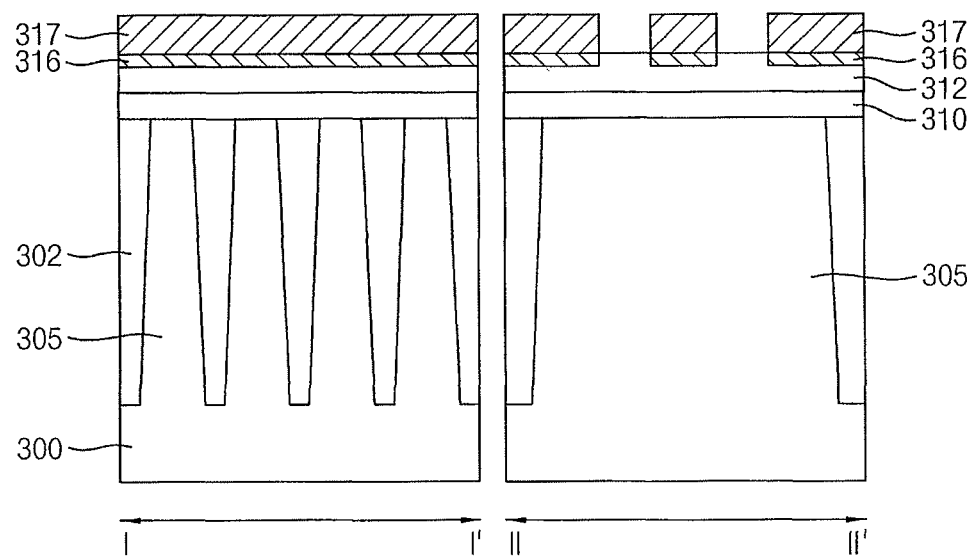

Referring to FIG. 19, the non-exposed portion 315 may be selectively removed using a developer solution such as a TMAH solution. A photoresist pattern 317 may be defined by the remaining exposed portion 313. The TMAH solution may be substantially hydrophilic so that the non-exposed portion 315 may be only removed without damaging the hydrophobic exposed portion 313.

Figure 20:
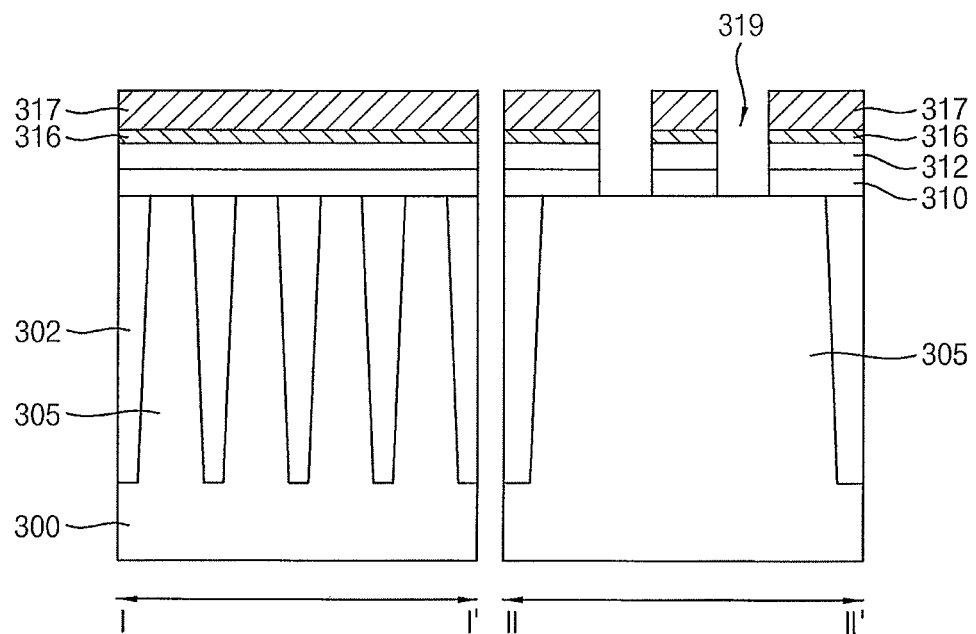

Referring to FIG. 20, the lower coating layer 312 and the etch-stop layer 310 may be sequentially and partially removed using the photoresist pattern 317 and the polarity conversion portion 316 as an etching mask. Accordingly, an opening 319 exposing a top surface of the active pattern 305 may be formed.

In example embodiments, the opening 319 may extend in the first direction, and may expose top surfaces of the active patterns 305 and the isolation layer 302. A plurality of the openings 319 may be formed along the second direction. In some embodiments, two of the openings 319 may extend on one of the active patterns 305 as illustrated in FIG. 20.

Referring to FIG. 21, upper portions of the active patterns 305 and the isolation layer 302 may be etched through the opening 319 to form a gate trench 309.

The gate trenches 309 may be formed to have an arrangement substantially comparable to that of the openings 319. For example, the gate trench 309 may extend in the first direction, and a plurality of the gate trenches 309 may be formed along the second direction. In some embodiments, two of the gate trenches 309 may be formed at one of the active patterns 305.

After the formation of the gate trench 309, the photoresist pattern 317, the polarity conversion portion 316, the lower coating layer 312 and the etch-stop layer 310 may be removed by, e.g., an ashing process, a strip process and/or a CMP process.

Figure 23:
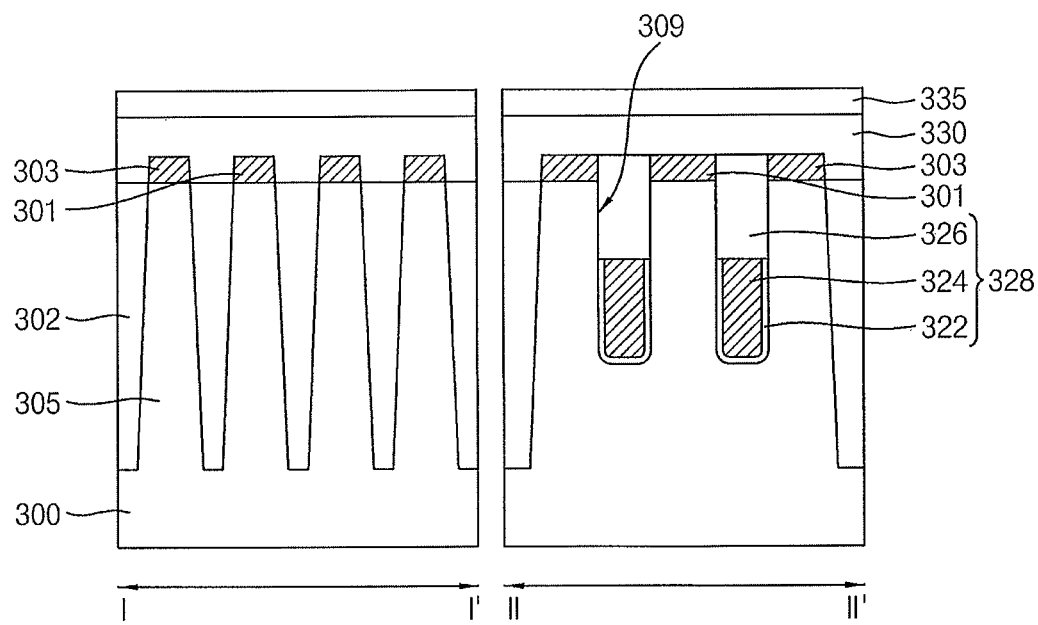

Referring to FIGS. 22 and 23, a gate structure 328 filling the gate trench 309 and extending in the gate trench 309 may be formed.

In example embodiments, a gate insulation layer may be formed on the active pattern 305 and an inner wall of the gate trench 309 by a thermal oxidation process or by depositing silicon oxide or a metal oxide through, e.g., a CVD process.

A gate conductive layer filling a remaining portion of the gate trench 309 may be formed on the gate insulation layer. The gate conductive layer may be planarized by a CMP process until the top surface of the active pattern 305 is exposed, and upper portions of the gate insulation layer and the gate conductive layer may be removed by an etch-back process. Accordingly, a gate insulation pattern 322 and a gate electrode 324 filling a lower portion of the gate trench 309 may be formed.

The gate conductive layer may be formed using a metal and/or a metal nitride by an ALD process or a sputtering process.

A mask layer filling a remaining portion of the gate trench 309 may be formed on the gate insulation pattern 322 and the gate electrode 324, and an upper portion of the mask layer may be planarized until the top surface of the active pattern 305 is exposed to form a gate mask 326. The mask layer may be formed of silicon nitride by, e.g., a CVD process.

Accordingly, the gate structure 328 including the gate insulation pattern 322, the gate electrode 324 and the gate mask 326 that are sequentially stacked in the gate trench 309 may be formed.

According to an arrangement of the gate trenches 309, a plurality of the gate structures 328 may be formed to be arranged along the second direction and each gate structure 328 may extend in the first direction. The gate structure 328 may be buried or embedded in the upper portion of the active pattern 305. The upper portion of the active pattern 305 may be divided into a central portion between two gate structures 328, and a peripheral portion (or end portions) facing the central portion with respect to each of the gate structure 328.

An ion-implantation process may be performed to form a first impurity region 301 and a second impurity region 303 at portions of the active pattern 305 adjacent to the gate structures 328. For example, the first impurity region 301 may be formed at the central portion of the active pattern 305, and the second impurity region 303 may be formed at the peripheral portions of the active pattern 305.

In some embodiments, as illustrated in FIG. 23, an upper portion of the isolation layer 302 may be recessed by an etch-back process such that the upper portion of the active pattern 305 may be exposed. Subsequently, the ion-implantation process may be performed to form the first and second impurity regions 301 and 303.

A capping layer 330 covering the active patterns 305 and the isolation layer 302 may be formed, and a first insulating interlayer 335 may be formed on the capping layer 330. For example, the capping layer 330 and the first insulating interlayer 335 may be formed of silicon nitride and silicon oxide, respectively. The capping layer 330 may substantially serve as an etch-stop layer during subsequent etching processes.

Figure 24:
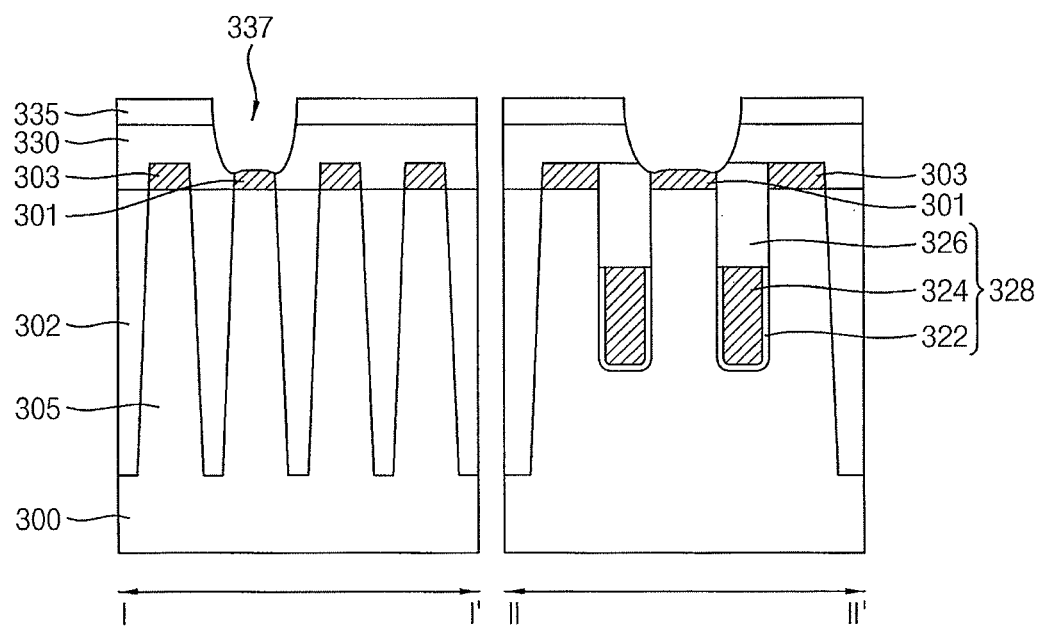

Referring to FIG. 24, the first insulating interlayer 335 and the capping layer 330 may be sequentially and partially etched to form a groove 337 through which the first impurity regions 301 may be exposed. The groove 337 may extend in the second direction indicated in FIG. 15, and a plurality of the grooves 337 may be formed to be arranged along the first direction.

In some embodiments, an upper portion of the first impurity region 301 may be partially removed during the etching process for the formation of the groove 337. Accordingly, a height difference between the first and second impurity regions 301 and 303 may be generated, and thus a bridge or a short circuit between a conductive line structure 355 and a conductive contact 375 (see FIG. 30) formed by subsequent processes may be prevented.

Referring to FIG. 25, a first conductive layer 340 filling the groove 337 may be formed on the first insulating interlayer 335. A barrier conductive layer 345 and a second conductive layer 347 may be sequentially formed on the first conductive layer 340, and a mask pattern 350 may be formed on the second conductive layer 347.

For example, the first conductive layer 340 may be formed using doped polysilicon, the barrier conductive layer 345 may be formed of a metal nitride or a metal silicide nitride, and the second conductive layer 347 may be formed using a metal. The first conductive layer 340, the barrier conductive layer 345 and the second conductive layer 347 may be formed by, e.g., a sputtering process, a PVD process, CVD process, or an ALD process.

The mask pattern 350 may include, e.g., silicon nitride, and may extend linearly in the second direction. A width of the mask pattern 350 (e.g., a width in the first direction) may be smaller than that of the groove 337.

In some embodiments, the mask pattern 350 may be formed by the method of forming patterns in accordance with example embodiments. For example, a mask layer including silicon nitride may be formed on the second conductive layer 347. Processes substantially the same as or similar to those illustrated with reference to FIGS. 2 to 7 may be performed using the mask layer as an object layer to form the mask pattern 350.

Figure 27:
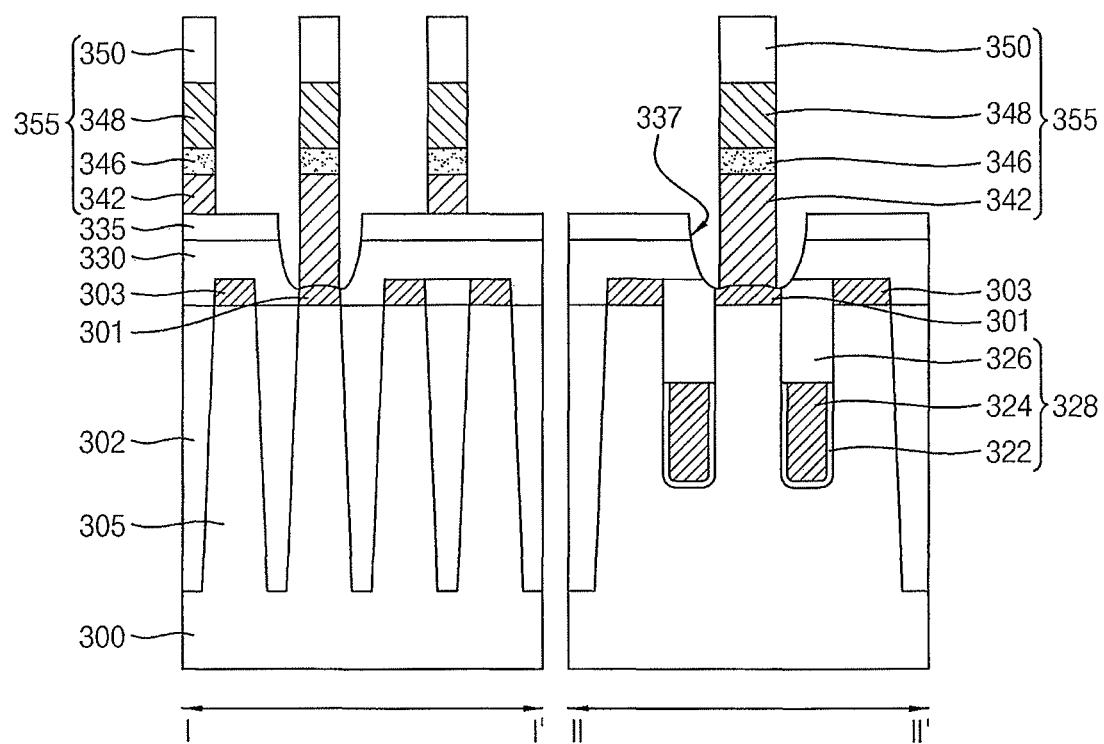

Referring to FIGS. 26 and 27, the second conductive layer 347, the barrier conductive layer 345 and the first conductive layer 340 may be sequentially etched using the mask pattern 350 as an etching mask. Accordingly, a first conductive pattern 342, a barrier conductive pattern 346 and a second conductive pattern 348 may be sequentially formed on the first impurity region 301. For convenience of descriptions, illustrations of the first insulating interlayer 335 and the capping layer 330 are omitted in FIG. 26.

Accordingly, the conductive line structure 355 including the first conductive pattern 342, the barrier conductive pattern 346, the second conductive pattern 348 and the mask pattern 350 may be formed. The conductive line structure 355 may extend in the second direction on the first impurity region 301. In example embodiments, the conductive line structure 355 may serve as a bit line.

In some embodiments, the conductive line structure 355 may have a narrower width than that of the groove 337. Thus, a sidewall of the conductive line structure 355 may be spaced apart from a sidewall of the groove 337.

Figure 28:
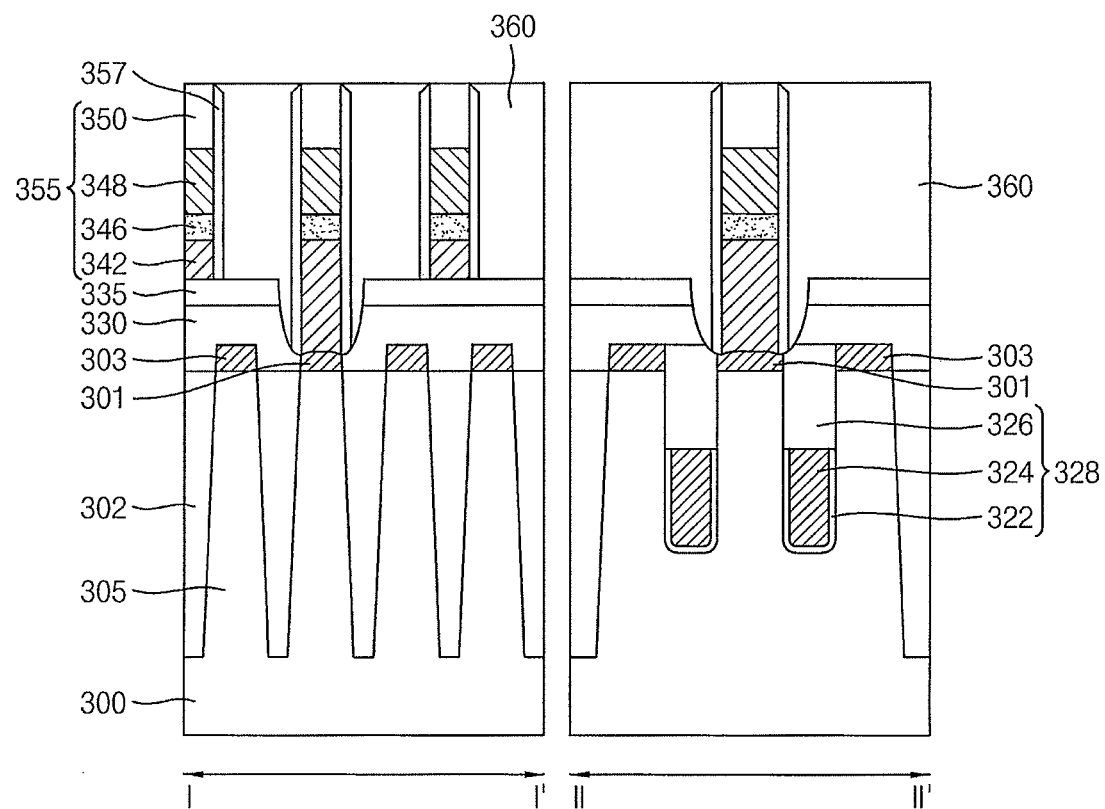

Referring to FIG. 28, a spacer 357 may be formed on the sidewall of the conductive line structure 355. For example, a spacer layer covering the conductive line structure 355 may be formed on the first insulating interlayer 335. The spacer layer may be anisotropically etched to form the spacer 357. The spacer layer may be formed of, e.g., silicon nitride.

A second insulating interlayer 360 covering the conductive line structure 355 may be formed on the first insulating interlayer 335. The second insulating interlayer 360 may fill a remaining portion of the groove 337.

In some embodiments, an upper portion of the second insulating interlayer 360 may be planarized by a CMP process such that a top surface of the mask pattern 350 may be exposed. The second insulating interlayer 360 may be formed of silicon oxide substantially the same as or similar to that of the first insulating interlayer 335.

Figure 29:
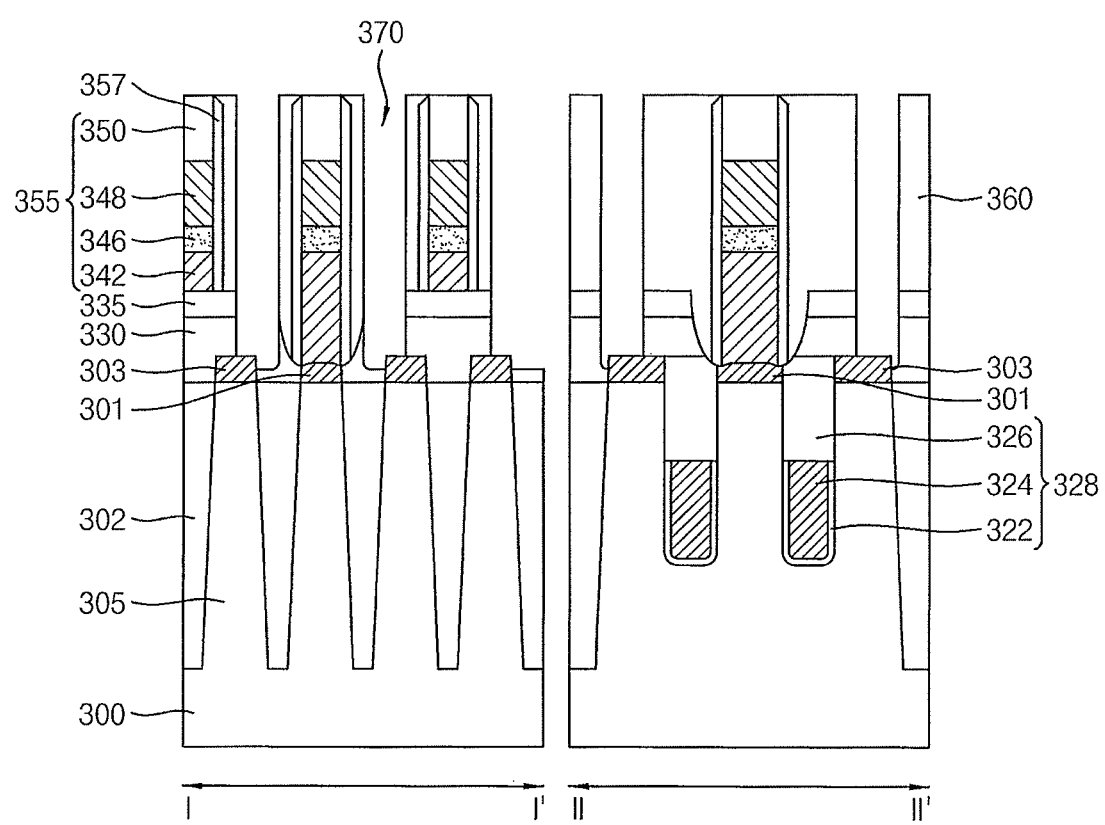

Referring to FIG. 29, the second insulating interlayer 360, the first insulating interlayer 335 and the capping layer 330 may be partially etched to form a contact hole 370 through which the second impurity region 303 may be exposed. The contact hole 370 may be formed per each of hole formation areas 357 indicated in FIG. 26.

In some embodiments, the contact hole 370 may be formed by the method of forming patterns in accordance with example embodiments. For example, as described with reference to FIG. 2, a lower coating layer and a photoresist layer may be formed on the second insulating interlayer 360 and the mask pattern 350. Processes substantially the same as or similar to those illustrated with reference to FIGS. 3 to 7 may be performed using the insulating interlayer 360 as an object layer to form the contact hole 370.

Figure 30:
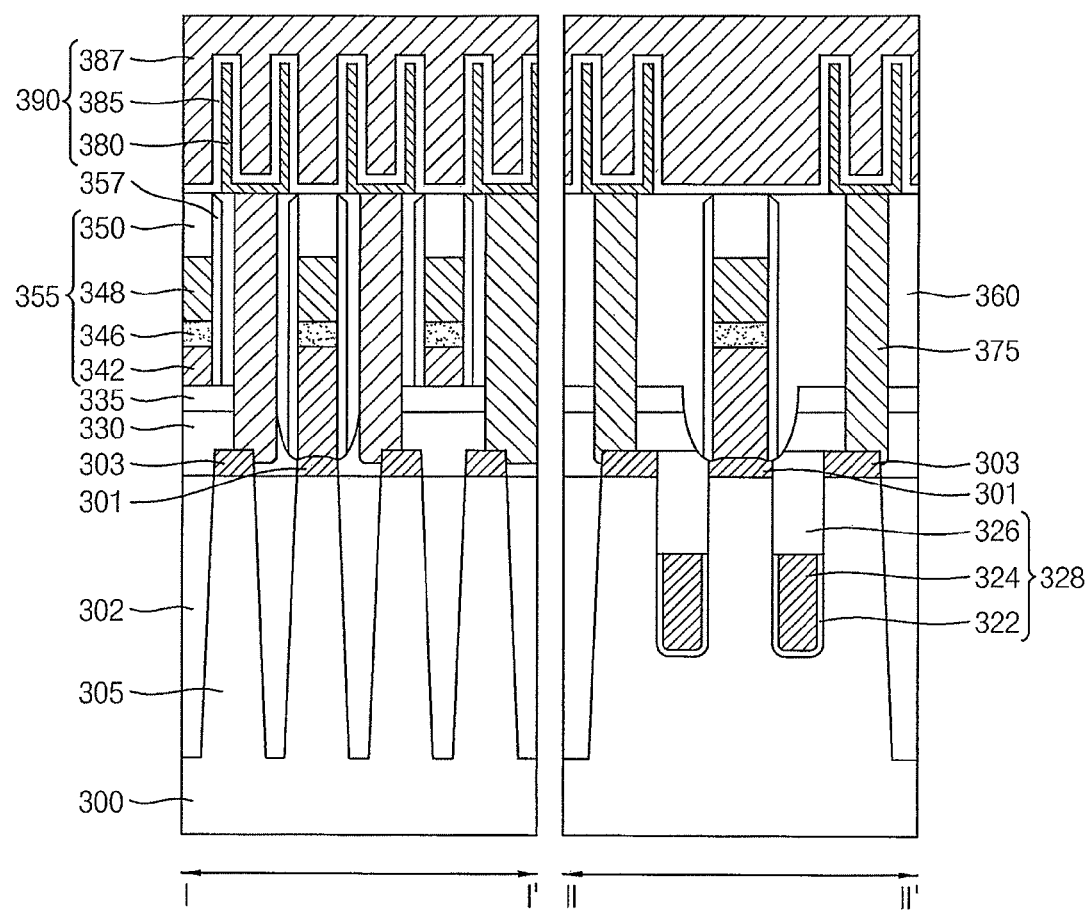

Referring to FIG. 30, the conductive contact 375 filling the contact hole 370 and electrically connected to the second impurity region 303 may be formed. For example, a capacitor 390 may be formed on the conductive contact 375. In this case, the conductive contact 375 may serve as a capacitor contact.

For example, a conductive layer filling the contact holes 370 may be formed, and an upper portion of the conductive layer may be planarized by a CMP process until the top surface of the mask pattern 350 is exposed. Accordingly, the conductive contact 375 may be formed in each contact hole 370, and may be in contact with the second impurity region 303.

The conductive layer may be formed using a metal such as copper or tungsten by a sputtering process, a PVD process, an ALD process, or a CVD process. In some embodiments, the conductive layer may be formed by an electroplating process or an electroless plating process. In some embodiments, a barrier conductive layer including, e.g., titanium or titanium nitride may be formed on an inner wall of the contact hole 370 before forming the conductive layer.

Subsequently, the capacitor 390 electrically connected to the conductive contact 375 may be formed. Thus, a dynamic random access memory (DRAM) device including the BCAT structure may be achieved.

For example, an etch-stop layer (not illustrated) and a mold layer (not illustrated) may be formed on the mask pattern 350, the second insulating interlayer 360 and the conductive contact 375. The mold layer and the etch-stop layer may be partially removed to form an opening through which a top surface of the conductive contact 375 may be exposed.

A lower electrode layer may be formed along an inner wall of the opening and a top surface of the mold layer. The lower electrode layer may be formed of a metal or a metal nitride. For example, the lower electrode layer may be formed of at least one of tungsten, tungsten nitride, titanium, titanium nitride, tantalum, tantalum nitride and/or ruthenium. A sacrificial layer (not illustrated) may be formed on the lower electrode layer, and upper portions of the sacrificial layer and the lower electrode layer may be planarized such that the top surface of the mold layer may be exposed. The sacrificial layer and the mold layer may be removed to form a lower electrode 380.

A dielectric layer 385 may be formed on surfaces of the etch-stop layer and the lower electrode 380, and an upper electrode 387 may be formed on the dielectric layer 385 to form the capacitor 390. The dielectric layer 385 may be formed of silicon oxide or a metal oxide having a high dielectric constant. The upper electrode 387 may be formed of a metal or a metal nitride substantially the same as or similar to that of the lower electrode 380.

In some embodiments, a magnetic tunnel junction (MTJ) structure may be formed on the conductive contact 375. In this case, the semiconductor device may serve as a magnetic random access memory (MRAM) device including the BCAT structure.

For example, a fixed layer, a free layer and a tunnel barrier layer interposed therebetween may be formed on the mask pattern 350, the second insulating interlayer 360 and the conductive contact 375. The fixed layer and the free layer may be formed of a magnetic material. The tunnel barrier layer may be formed of, e.g., at least one of magnesium oxide, titanium oxide, aluminum oxide, magnesium zinc oxide and magnesium boron oxide.

The free layer, the tunnel barrier layer and the fixed layer may be partially etched to form the MTJ structure on each conductive contact 375. In some embodiments, the etching process for the free layer, the tunnel barrier layer and the fixed layer may include a photolithography process or the method of forming patterns illustrated with reference to FIGS. 2 to 7.

According to example embodiments, a polymer or a repeating unit capable of reacting with an acid generated from an exposure process may be inserted in a lower coating layer under a photoresist layer. For example, the lower coating layer may include a tertiary alcohol group capable of being easily removed by the acid. A hydroxyl group included in the tertiary alcohol group may be removed by the acid so that a portion of the lower coating layer which may be in contact with an exposed portion of the photoresist layer may become hydrophobic similarly to the exposed portion. Therefore, an adhesion or an affinity between the photoresist pattern and the lower coating layer may be improved, and the photoresist pattern may retain a desired pattern profile in a subsequent process.

The foregoing is illustrative of example embodiments and is not to be construed as limiting thereof. Although a few example embodiments have been described, those skilled in the art will readily appreciate that many modifications are possible in the example embodiments. Accordingly, all such modifications are intended to be included within the scope of the embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a pattern, the method comprising:
sequentially forming a lower coating layer and a photoresist layer on an object layer that is on a substrate, the photoresist layer being formed of a photoresist composition including a negative-tone photoresist polymer and a photoacid generator;
performing an exposure process such that the photoresist layer is divided into an exposed portion and a non-exposed portion;
transforming a portion of the lower coating layer overlapping or contacting the exposed portion at least partially into a polarity conversion portion that has a polarity substantially identical to that of the exposed portion such that the polarity conversion portion is formed by diffusing acid generated from the photoacid generator into the portion of the lower coating layer under the exposed portion; and
selectively removing the non-exposed portion of the photoresist layer.

2. The method of claim 1, wherein the lower coating layer and the photoresist layer are initially hydrophilic.

3. The method of claim 2, wherein:
performing the exposure process includes converting the polarity of the exposed portion to be hydrophobic by the acid generated from the photoacid generator.

4. The method of claim 1, wherein the lower coating layer includes a polymer having a repeating unit to which a polarity conversion group is combined.

5. The method of claim 4, wherein transforming the portion of the lower coating layer includes inducing a dehydration reaction in the polarity conversion group by the acid diffused into the portion of the lower coating layer.

6. The method of claim 5, wherein:
the polarity conversion group includes a tertiary alcohol group, and
a hydroxyl group included in the tertiary alcohol group is replaced with a double bond.

7. The method of claim 6, wherein the polarity conversion group includes an alicyclic hydrocarbon group or an aromatic hydrocarbon group which is combined with the tertiary alcohol group.

8. The method of claim 4, wherein the polarity conversion group is represented by one of the following formulae:

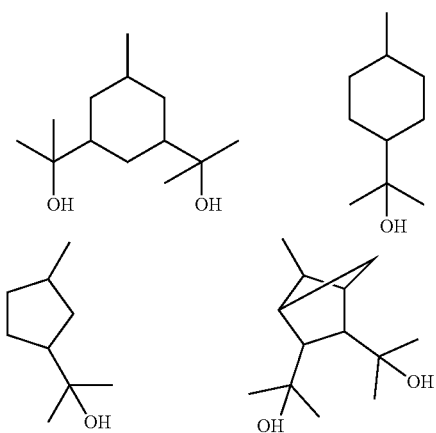

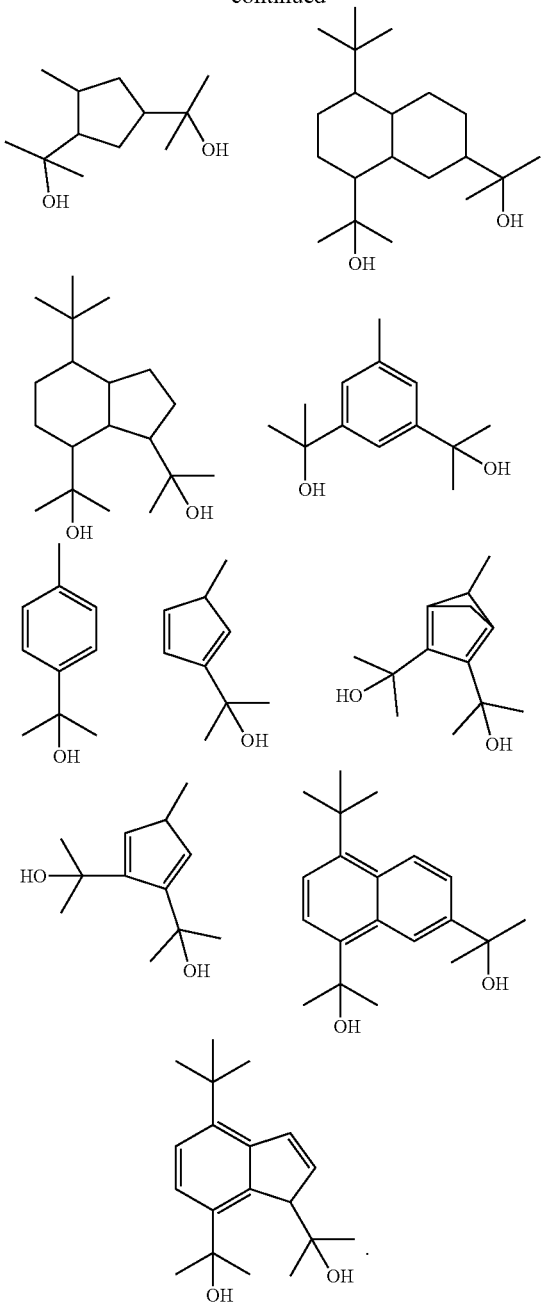

9. The method of claim 1, further comprising partially removing the object layer using the exposed portion as an etching mask.

10. A method of forming a pattern, the method comprising:
forming a lower coating layer on an object layer that is on a substrate, the lower coating layer including a polymer to which a polarity conversion group is combined;
forming a photoresist layer on the lower coating layer;
performing an exposure process on the photoresist layer such that the photoresist layer is divided into an exposed portion having a converted polarity and a non-exposed portion retaining a polarity thereof;
inducing a dehydration reaction in the polarity conversion group included in a portion of the lower coating layer under the exposed portion; and removing the non-exposed portion of the photoresist layer, wherein the polarity conversion group is represented by one of the following formulae:

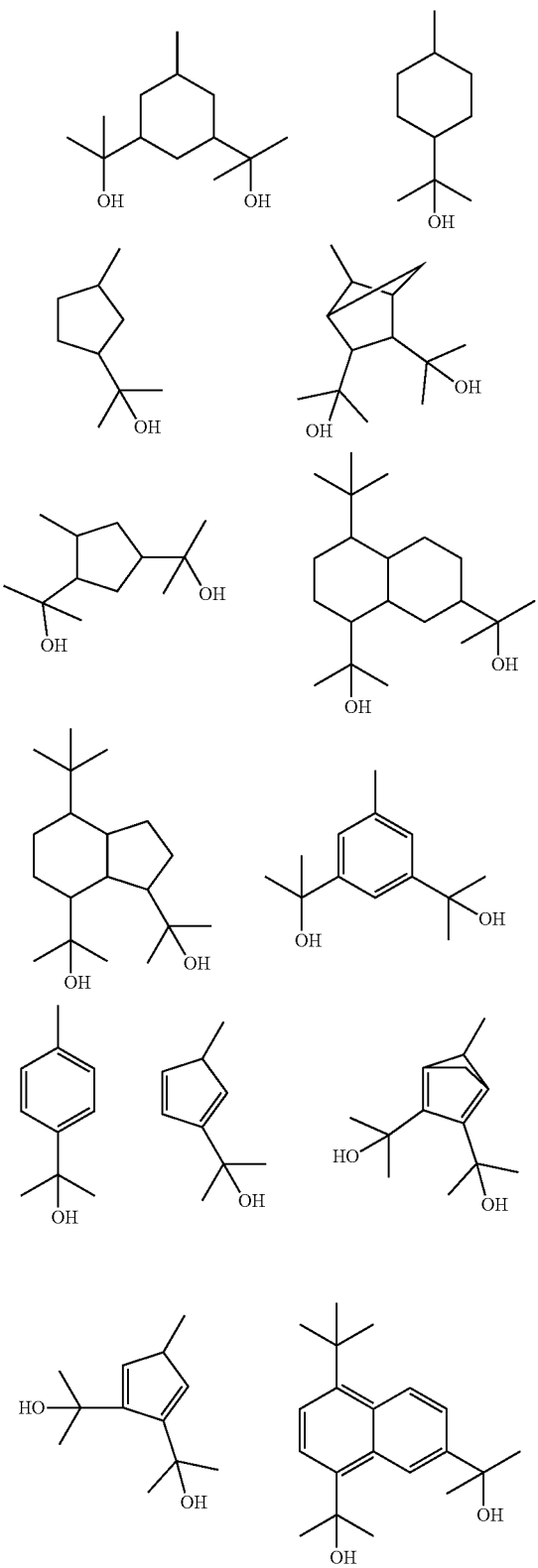

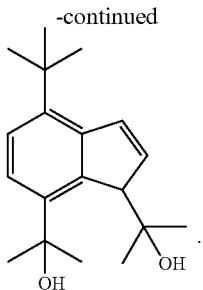

11. The method of claim 10, wherein the lower coating layer includes a bottom anti-reflection coating polymer and a polarity conversion polymer having a repeating unit to which the polarity conversion group is combined.

12. The method of claim 11, wherein the bottom anti-reflection coating polymer is represented by Chemical Formula 7 or Chemical Formula 8:

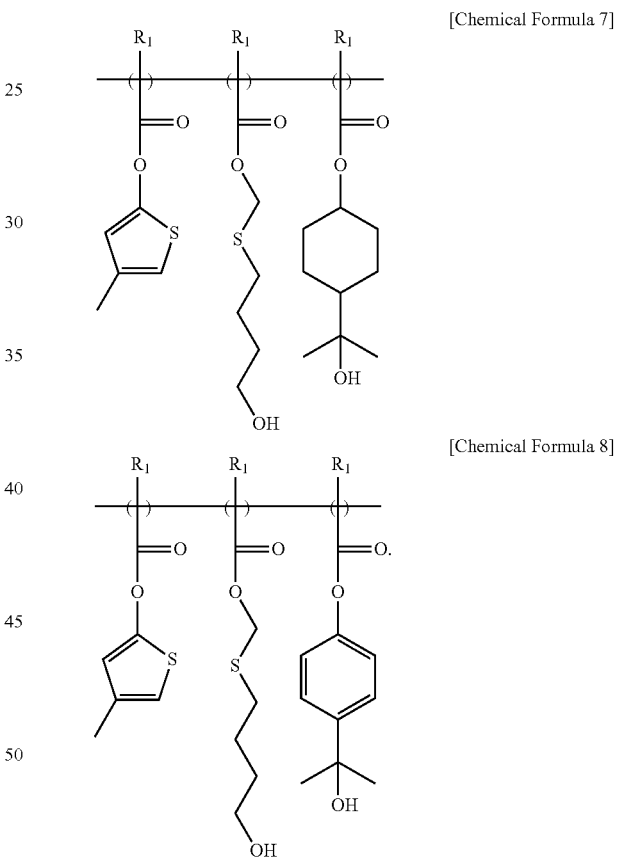

13. The method of claim 10, wherein the lower coating layer includes a bottom anti-reflection coating polymer in which the polarity conversion group is incorporated.

14. The method of claim 10, wherein:
inducing the dehydration reaction includes forming a polarity conversion portion at the portion of the lower coating layer under the exposed portion, and
the polarity conversion portion and the exposed portion are hydrophobic.

15. The method of claim 10, wherein the exposed portion includes a double bond created by removal of a hydroxyl group through a dehydration reaction.

16. A method of forming a pattern, the method comprising:
  forming an isolation layer on a substrate such that an active pattern is defined by the isolation layer;
  sequentially forming a lower coating layer and a photoresist layer on the active pattern and the isolation layer, the photoresist layer being formed of a photoresist composition including a negative-tone photoresist polymer and a photoacid generator;
  performing an exposure process such that the photoresist layer is divided into an exposed portion and a non-exposed portion;
  transforming a portion of the lower coating layer overlapping or contacting the exposed portion at least partially into a polarity conversion portion that has a polarity substantially identical to that of the exposed portion such that the polarity conversion portion is formed by diffusing acid generated from the photoacid generator into the portion of the lower coating layer under the exposed portion;
  selectively removing the non-exposed portion of the photoresist layer; and
  partially removing the active pattern using the exposed portion as an etching mask.

17. The method of claim 16, wherein the lower coating layer includes a polymer represented by Chemical Formula 3:

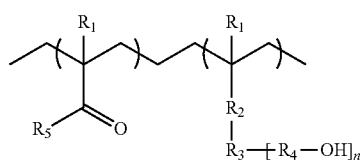

[Chemical Formula 3]

wherein, in Chemical Formula 3, $R_1$ is hydrogen or a $C_1$-$C_4$ alkyl group,
  $R_2$ is a divalent group selected from $C_1$-$C_6$ alkylene, arylene, acrylate, carbonyl, oxy, ester, or a combination thereof,
  $R_3$ is an alicyclic hydrocarbon group or an aromatic hydrocarbon group,
  $R_4$ is a $C_3$-$C_{10}$ branched alkylene group,
  $R_5$ is a hydroxyl group, a $C_1$-$C_6$ alkyl group or a $C_1$-$C_6$ alkyl group combined with a hydroxyl group, and
  n is an integer of 1 or 2.

18. The method of claim 16, wherein:
  the lower coating layer includes a polymer having a repeating unit to which a polarity conversion group is combined, and
  the polarity conversion group is represented by one of the following formulae:

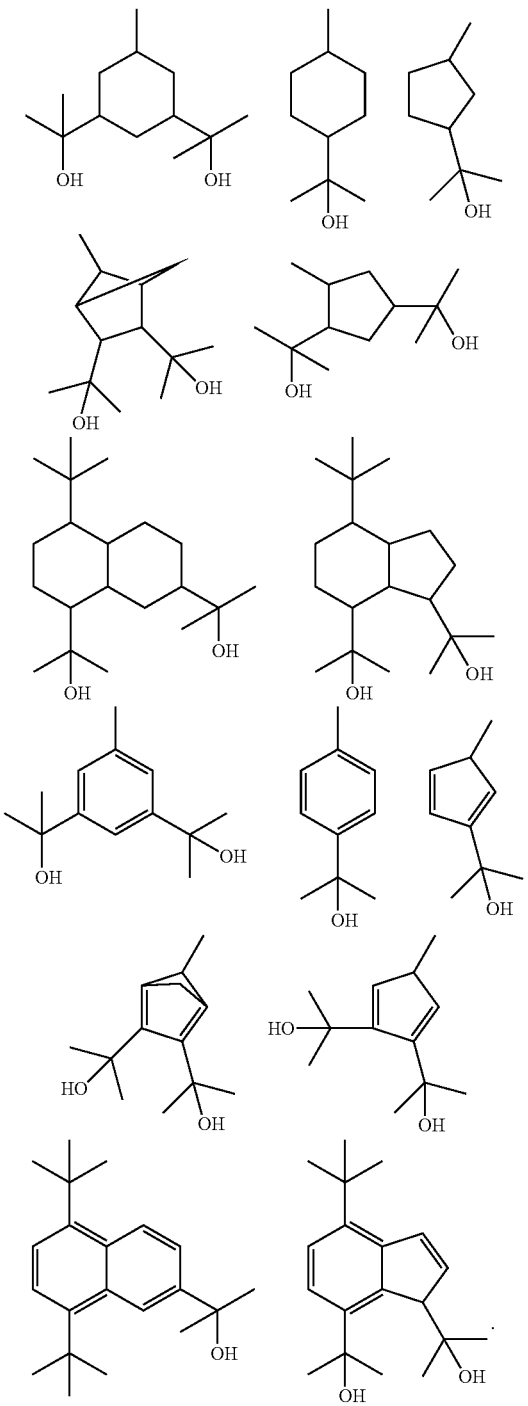

* * * * *